(12) United States Patent
Wang et al.

(10) Patent No.: US 11,823,958 B2
(45) Date of Patent: Nov. 21, 2023

(54) SEMICONDUCTOR DEVICE AND METHOD

(71) Applicant: Taiwan Semiconductor Manufacturing Co., Ltd., Hsinchu (TW)

(72) Inventors: Shiang-Bau Wang, Pingzchen (TW); Li-Wei Yin, Hsinchu (TW); Chen-Huang Huang, Hsinchu (TW); Ming-Jhe Sie, Taipei (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/379,469

(22) Filed: Jul. 19, 2021

(65) Prior Publication Data
US 2021/0351084 A1 Nov. 11, 2021

Related U.S. Application Data

(62) Division of application No. 16/429,270, filed on Jun. 3, 2019, now Pat. No. 11,069,579.
(Continued)

(51) Int. Cl.
*H01L 21/8238* (2006.01)
*H01L 27/092* (2006.01)
(Continued)

(52) U.S. Cl.
CPC .. *H01L 21/823821* (2013.01); *H01L 21/3065* (2013.01); *H01L 21/76829* (2013.01);
(Continued)

(58) Field of Classification Search
CPC ......... H01L 21/823821; H01L 21/3065; H01L 21/76829; H01L 21/823828; H01L 21/823864; H01L 21/823871; H01L 27/0924; H01L 29/6653; H01L 29/66545; H01L 29/66795; H01L 29/785; H01L 21/7682; H01L 23/485; H01L 21/31111; H01L 21/31116; H01L 29/41791;
(Continued)

(56) References Cited

U.S. PATENT DOCUMENTS 9,105,490 B2   8/2015   Wang et al.
9,236,267 B2   1/2016   De et al.
(Continued)

FOREIGN PATENT DOCUMENTS

CN       107039424 A       8/2017
KR    20130022954 A       3/2013
(Continued)

*Primary Examiner* — Cuong B Nguyen
(74) *Attorney, Agent, or Firm* — Slater Matsil, LLP

(57) ABSTRACT

In an embodiment, a device includes: a first fin extending from a substrate; a gate stack disposed on the first fin; a source/drain region disposed in the first fin; a contact etch stop layer (CESL) disposed over the source/drain region; a gate spacer extending along a side of the gate stack; and a dielectric plug disposed between the CESL and the gate spacer, where the dielectric plug, the CESL, the gate spacer, and the source/drain region collectively define a void physically separating the gate stack from the source/drain region.

20 Claims, 46 Drawing Sheets

Related U.S. Application Data

(60) Provisional application No. 62/747,831, filed on Oct. 19, 2018.

(51) Int. Cl.
*H01L 21/3065* (2006.01)
*H01L 29/66* (2006.01)
*H01L 29/78* (2006.01)
*H01L 21/768* (2006.01)

(52) U.S. Cl.
CPC ......... *H01L 21/823828* (2013.01); *H01L 21/823864* (2013.01); *H01L 21/823871* (2013.01); *H01L 27/0924* (2013.01); *H01L 29/6653* (2013.01); *H01L 29/66545* (2013.01); *H01L 29/66795* (2013.01); *H01L 29/785* (2013.01)

(58) Field of Classification Search
CPC ......... H01L 29/165; H01L 29/4991; H01L 29/6656; H01L 29/7848; H01L 29/0642; H01L 29/42356; H01L 29/7842; H01L 21/306; H01L 21/762; H01L 21/823431; H01L 21/823468; H01L 29/0653; H01L 29/66719; H01L 29/66553; H01L 29/66689; H01L 21/28132; H01L 21/28141; H01L 21/2815
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,496,400 B1 | 11/2016 | Balakrishnan et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,859,432 B2 | 1/2018 | Ko et al. |
| 10,164,069 B2 | 12/2018 | Ching et al. |
| 10,522,642 B2 | 12/2019 | Lee et al. |
| 2014/0024192 A1 | 1/2014 | Kim et al. |
| 2015/0243544 A1 | 8/2015 | Alptekin et al. |
| 2015/0318399 A1* | 11/2015 | Jeong ............ H01L 29/413 257/401 |
| 2016/0365426 A1* | 12/2016 | Ching ............ H01L 29/785 |
| 2017/0084714 A1 | 3/2017 | Ching et al. |
| 2017/0141215 A1 | 5/2017 | Ching et al. |
| 2017/0317213 A1* | 11/2017 | Park ............ H01L 29/785 |
| 2018/0097059 A1 | 4/2018 | Bi et al. |
| 2018/0174904 A1 | 6/2018 | Hsieh et al. |
| 2019/0198639 A1* | 6/2019 | Kim ............ H01L 29/6656 |

FOREIGN PATENT DOCUMENTS

| | | |
|---|---|---|
| KR | 20140012443 A | 2/2014 |
| KR | 20170062618 A | 6/2017 |
| KR | 20180060952 A | 6/2018 |
| KR | 20180068846 A | 6/2018 |
| TW | 201644053 | 12/2016 |
| TW | 201820457 A | 6/2018 |
| TW | 201834079 A | 9/2018 |

* cited by examiner

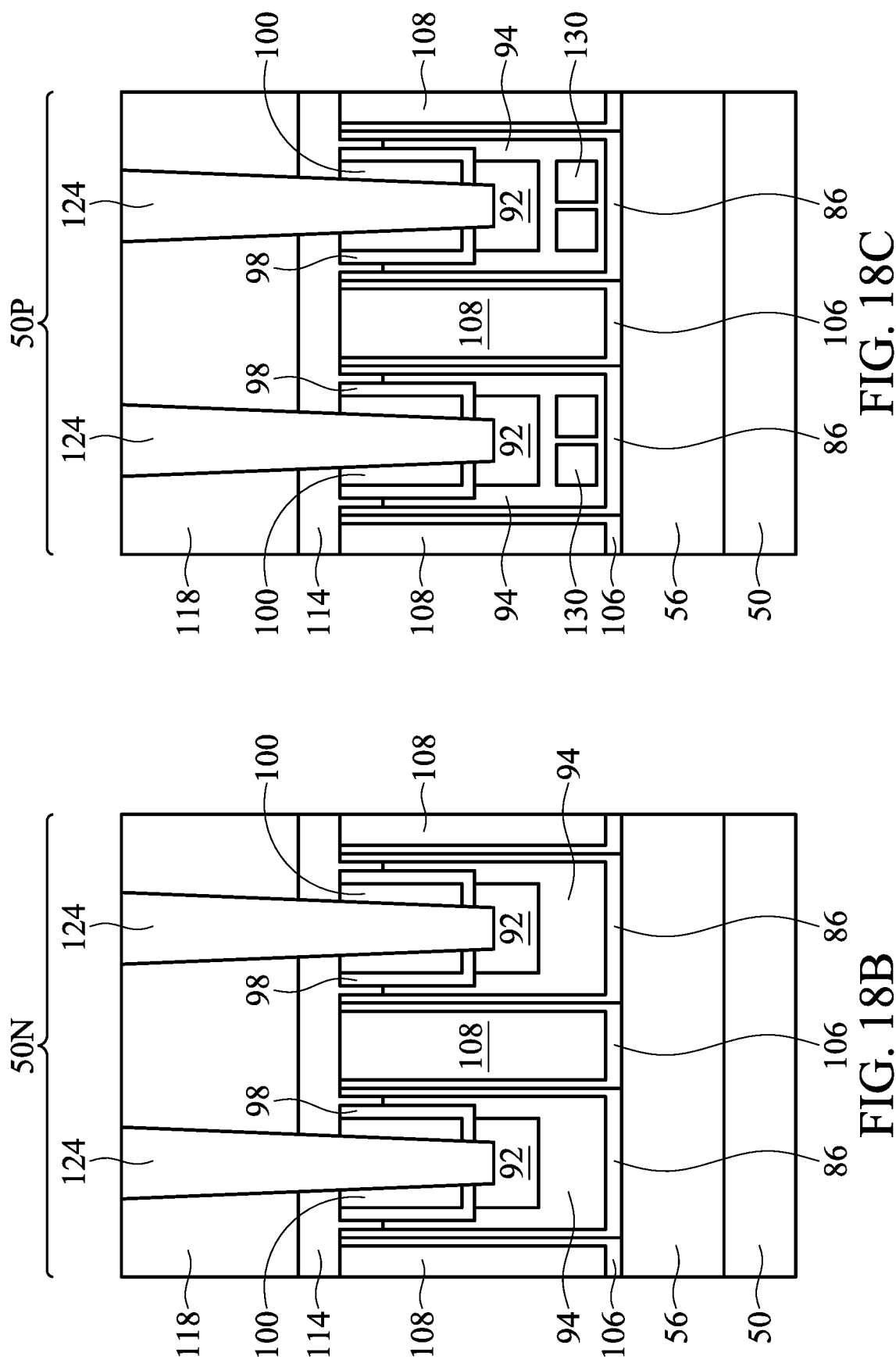

SEMICONDUCTOR DEVICE AND METHOD

PRIORITY CLAIM AND CROSS-REFERENCE

This application is a division of U.S. patent application Ser. No. 16/429,270, filed on Jun. 3, 2019, entitled "Semiconductor Device and Method," which claims the benefit of U.S. Provisional Application No. 62/747,831, filed on Oct. 19, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
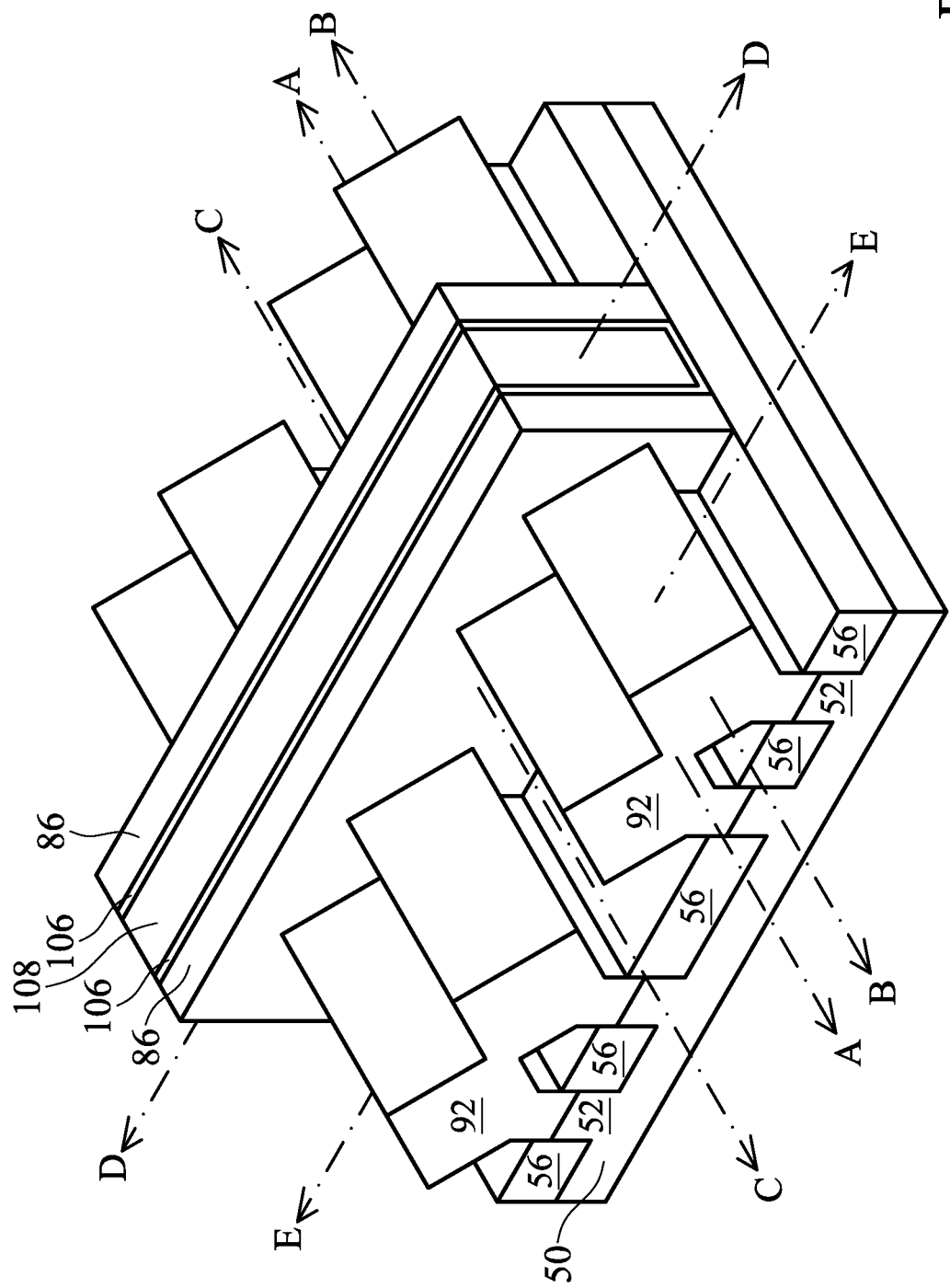
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, multiple gate spacers are formed for a FinFET, and one of the gate spacers is removed to define a void in the resulting FinFET. The void occupies at least a portion of the region formerly occupied by the removed gate spacer, and remains in the final FinFET device. The voids may be filled with air or may be at a vacuum, such that regions between the gate electrodes and source/drain regions of the FinFET have a high relative permittivity. The capacitance between the gate electrodes and source/drain contacts of the FinFET may thus be reduced, thereby reducing current leakage in the FinFET.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Isolation regions 56 are disposed over the substrate 50, and the fins 52 protrude above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring isolation regions 56.

Gate dielectrics 106 are along sidewalls and over top surfaces of the fins 52, and gate electrodes 108 are over the gate dielectrics 106. Source/drain regions 92 are disposed in opposite sides of the fin 52 with respect to the gate dielectrics 106 and gate electrodes 108. Gate spacers 86 separate the source/drain regions 92 from the gate dielectrics 106 and gate electrodes 108. In embodiments where multiple transistors are formed, the source/drain regions 92 may be shared between various transistors. In embodiments where one transistor is formed from multiple fins 52, neighboring source/drain regions 92 may be electrically connected, such as through coalescing the source/drain regions 92 by epitaxial growth, or through coupling the source/drain regions 92 with a same source/drain contact.

FIG. 1 further illustrates several reference cross-sections. Cross-section A-A is along portions of the isolation regions 56 beneath neighboring source/drain regions 92. Cross-section B-B is parallel to cross-section A-A and is along a longitudinal axis of a fin 52. Cross-section C-C is parallel to cross-section A-A and is along portions of the isolation regions 56 between coalesced source/drain regions 92. Cross-section D-D is perpendicular to cross-section A-A and is along a longitudinal axis of a gate electrode 108. Cross-section E-E is perpendicular to cross-section A-A and is across neighboring source/drain regions 92. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2, 3, 4, 5, and 6 are three-dimensional views of intermediate stages in the manufacturing of FinFETs, in accordance with some embodiments.

Figure 2:
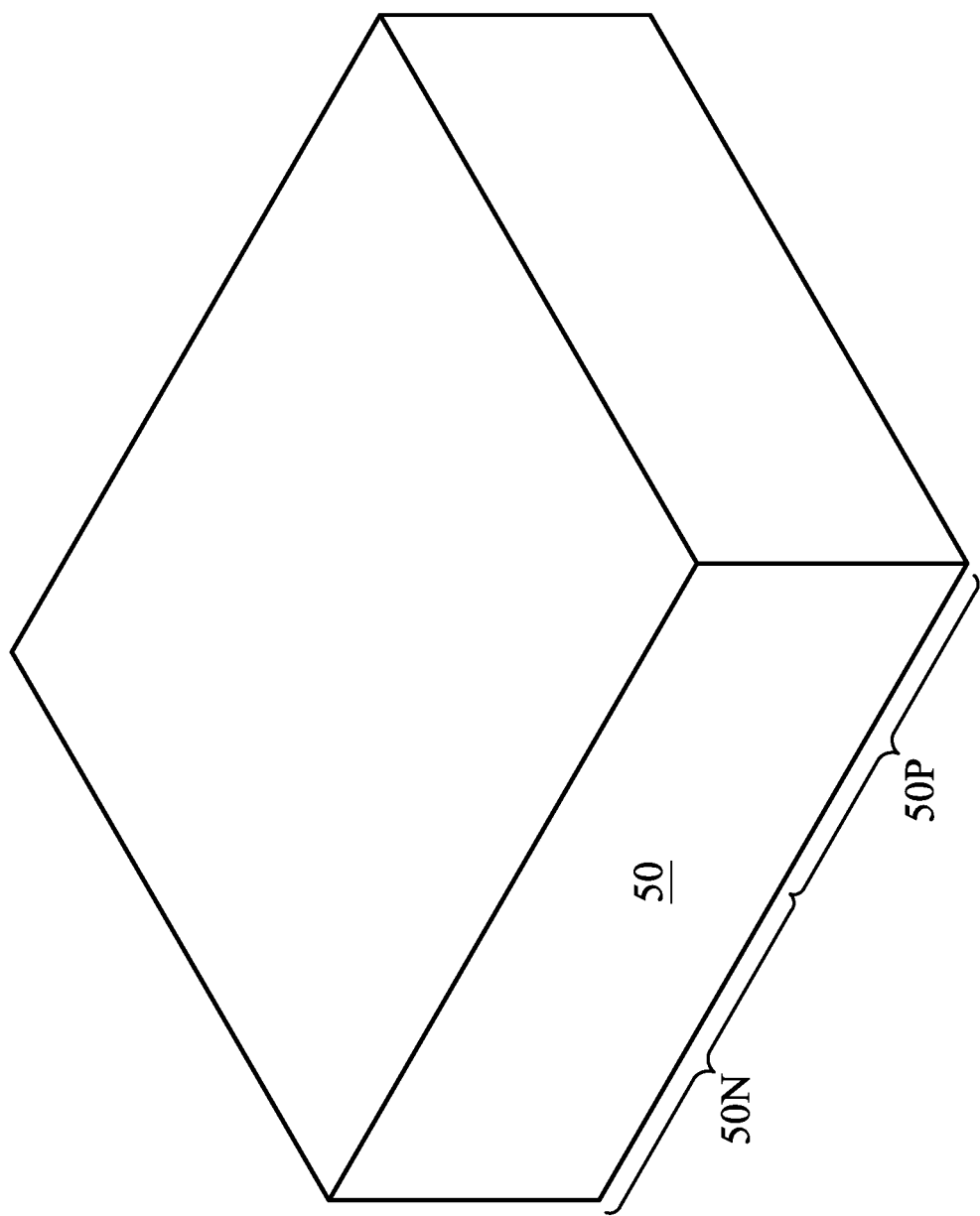
FIGS. 2 through 18C are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Figure 3:
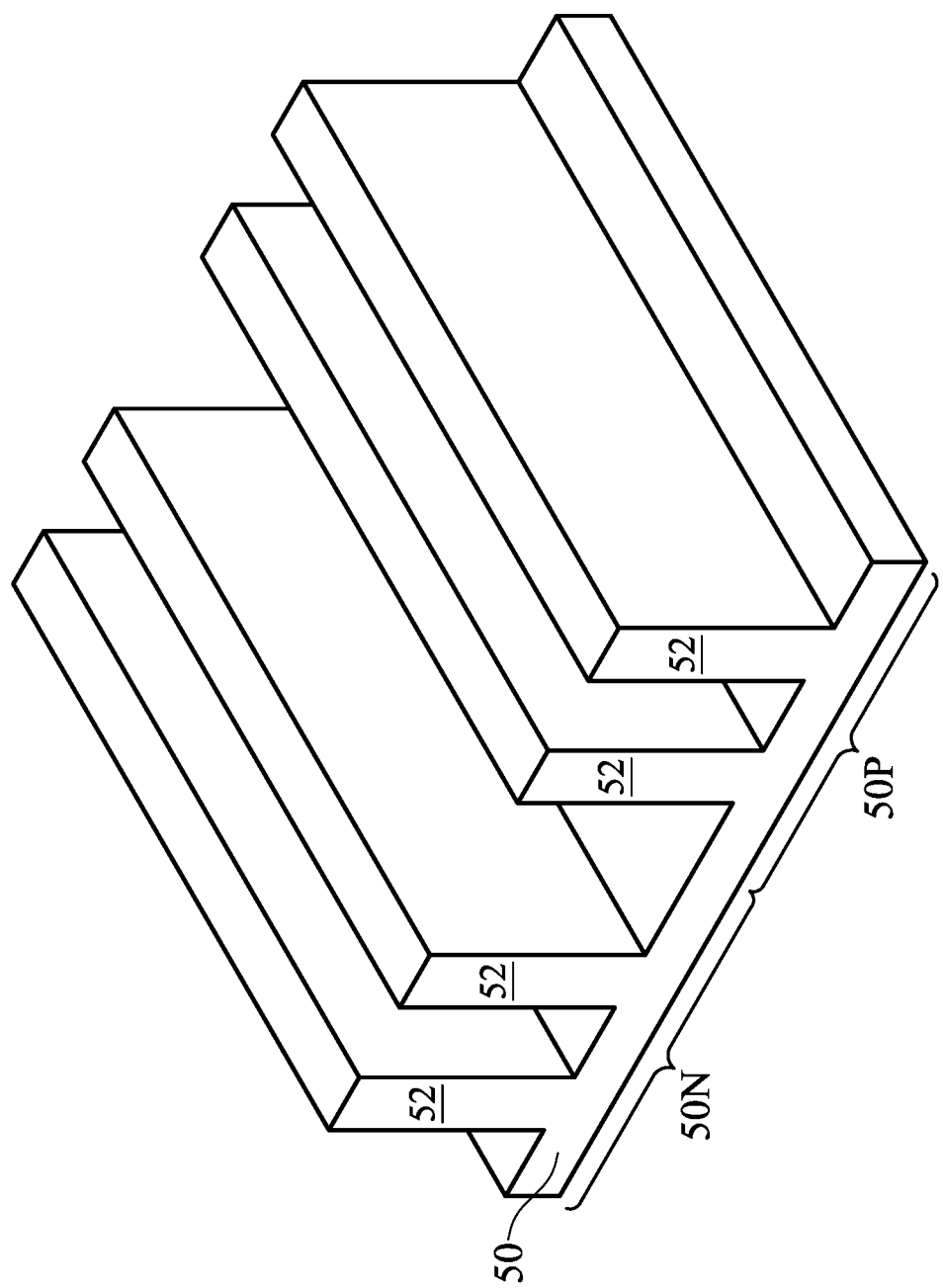

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
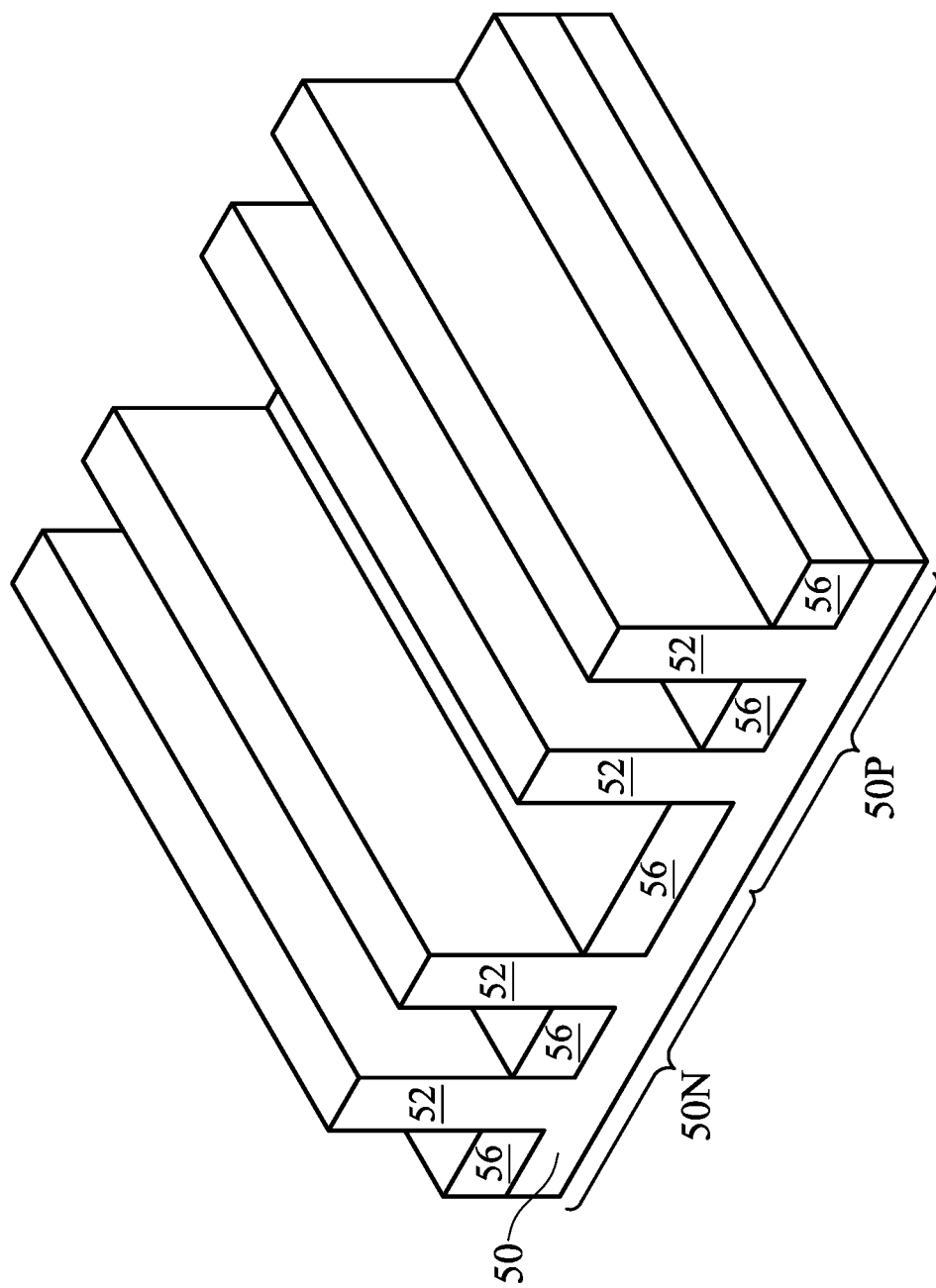

In FIG. 4, Shallow Trench Isolation (STI) regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 5:
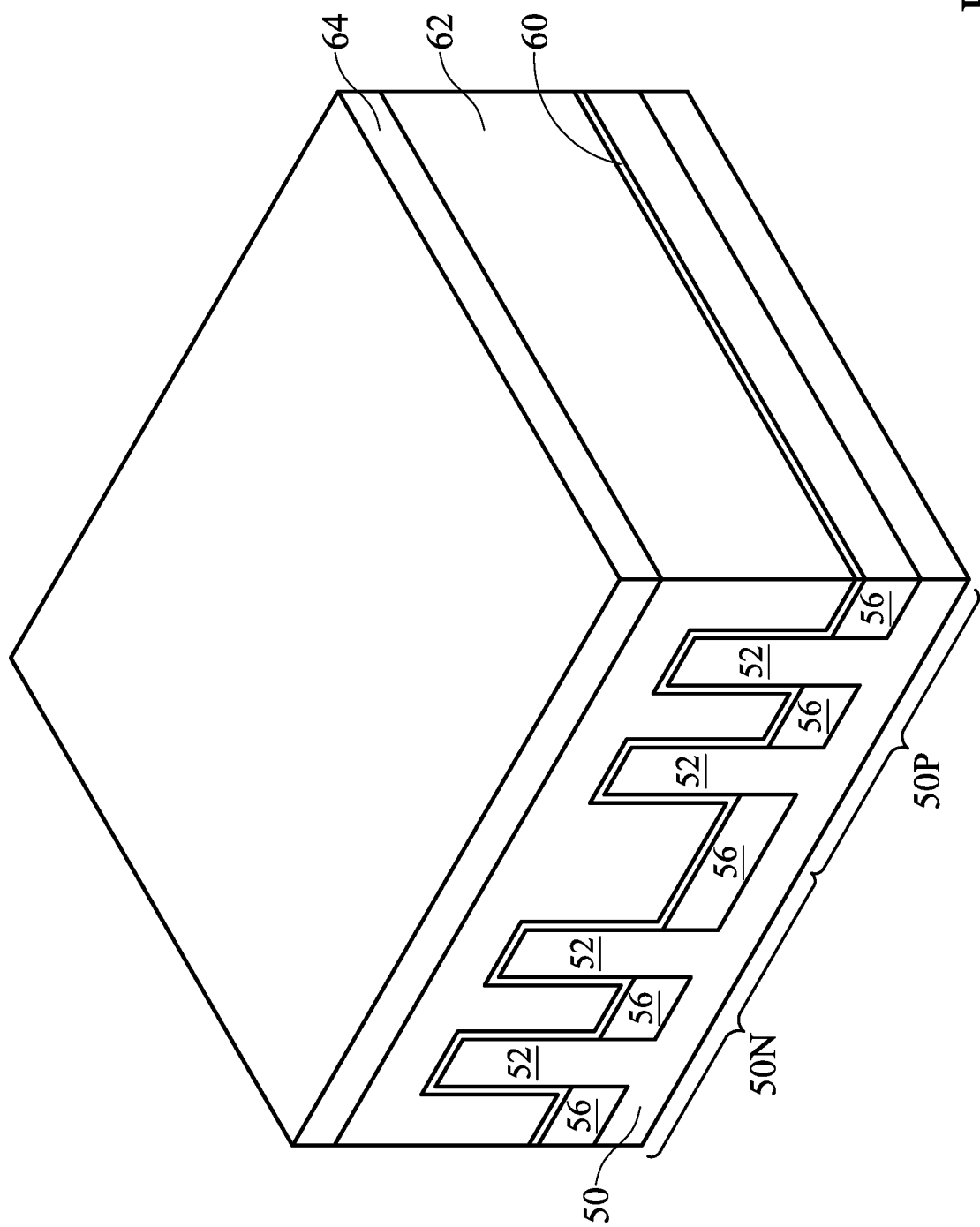

In FIG. 5, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 6:
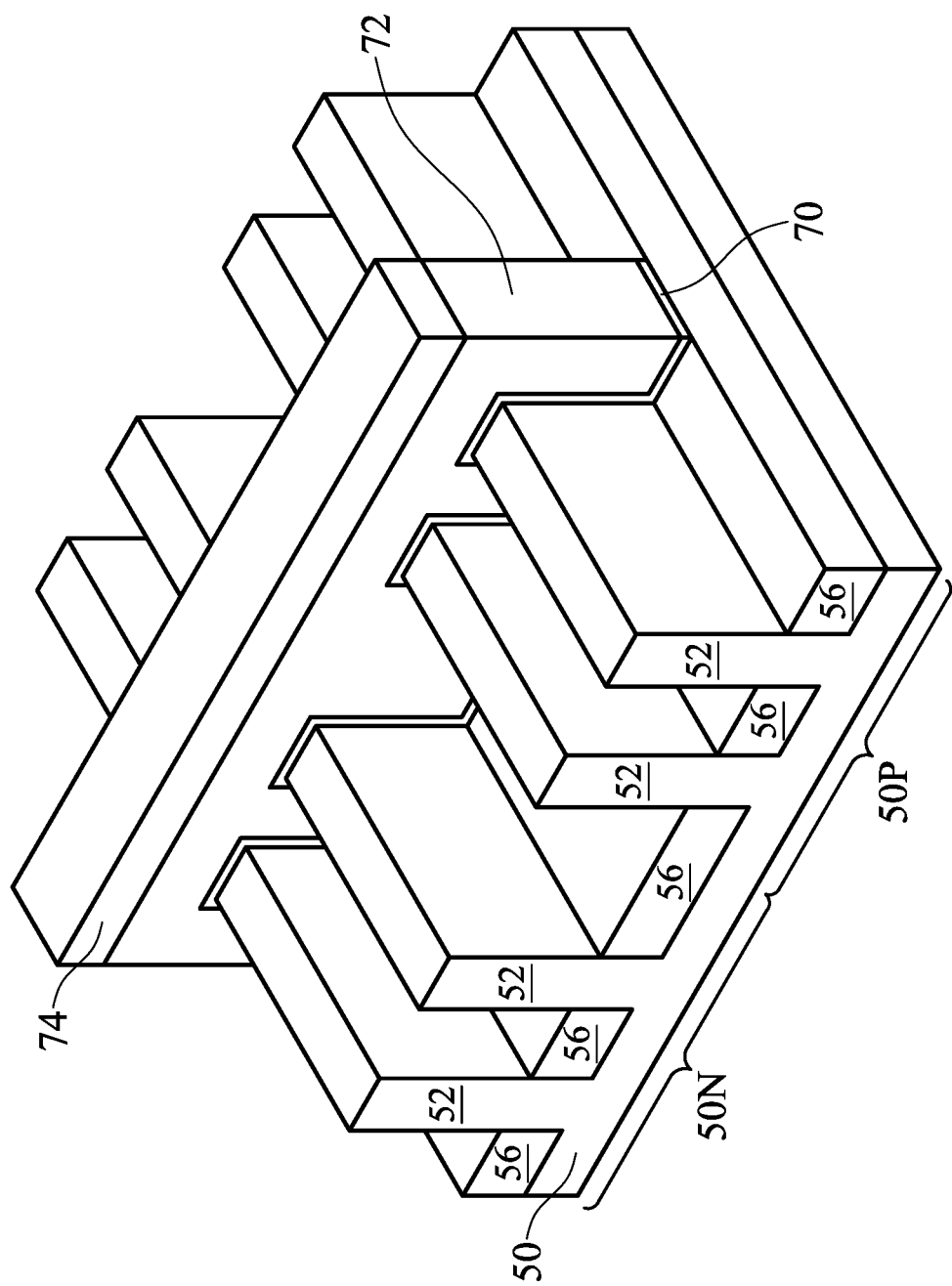
Figure 7A:
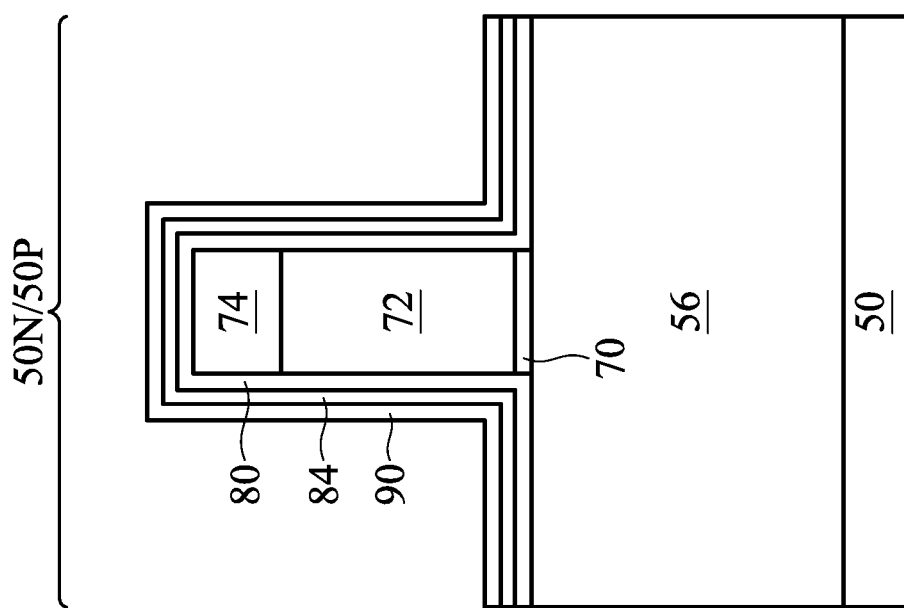
Figure 7C:
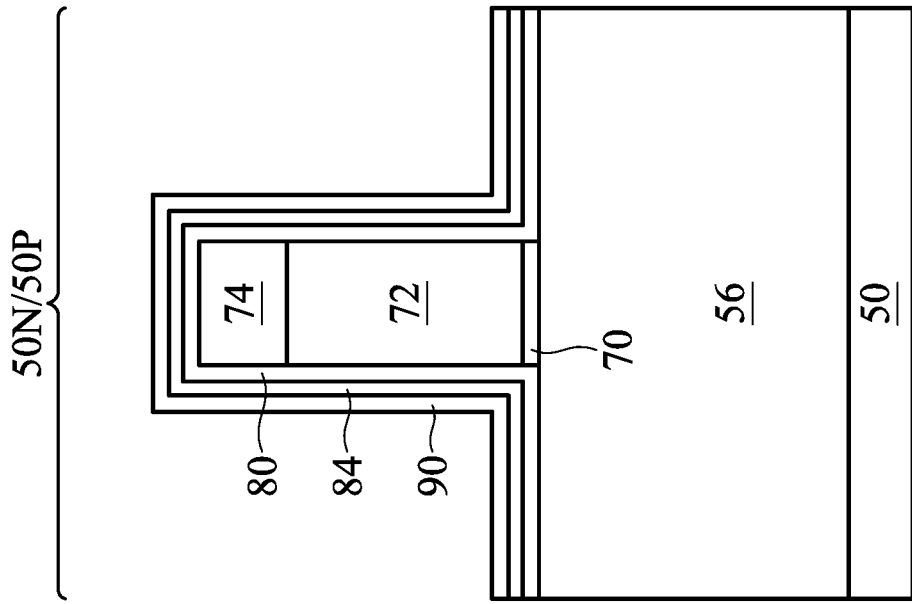
Figure 7B:
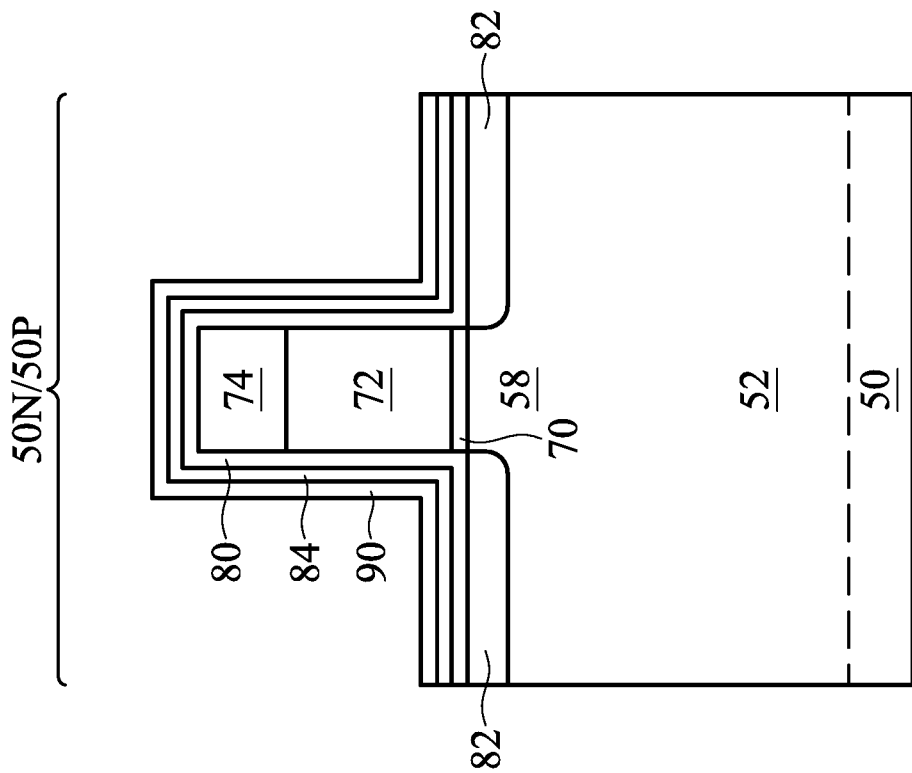
Figure 7D:
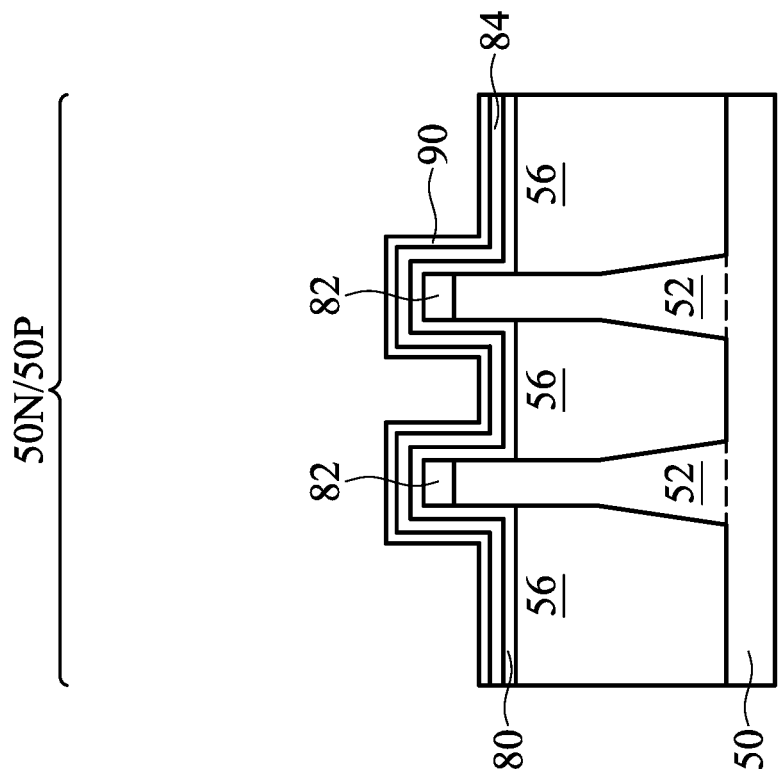
Figure 7E:
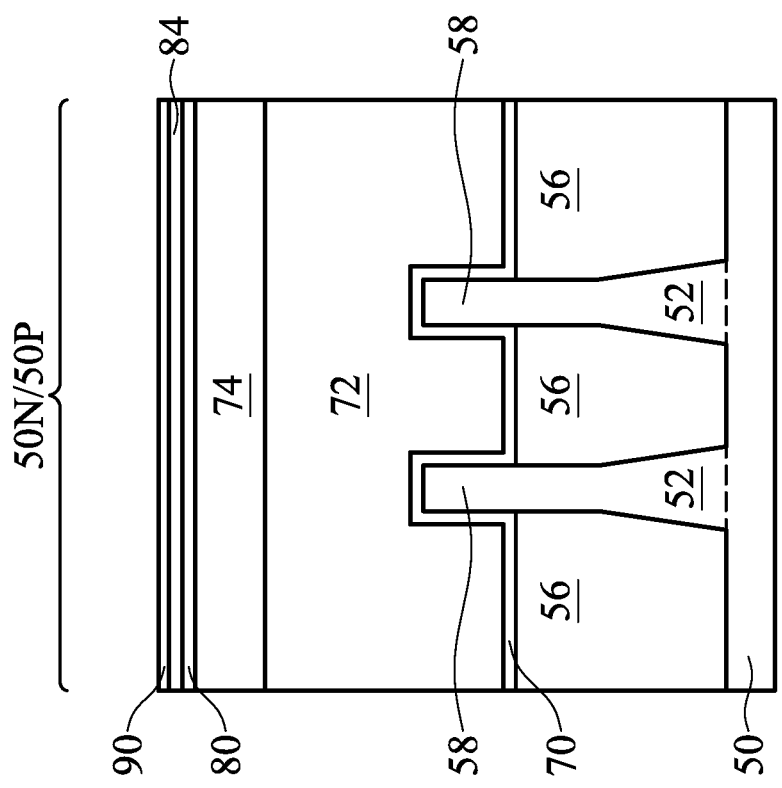
Figure 8A:
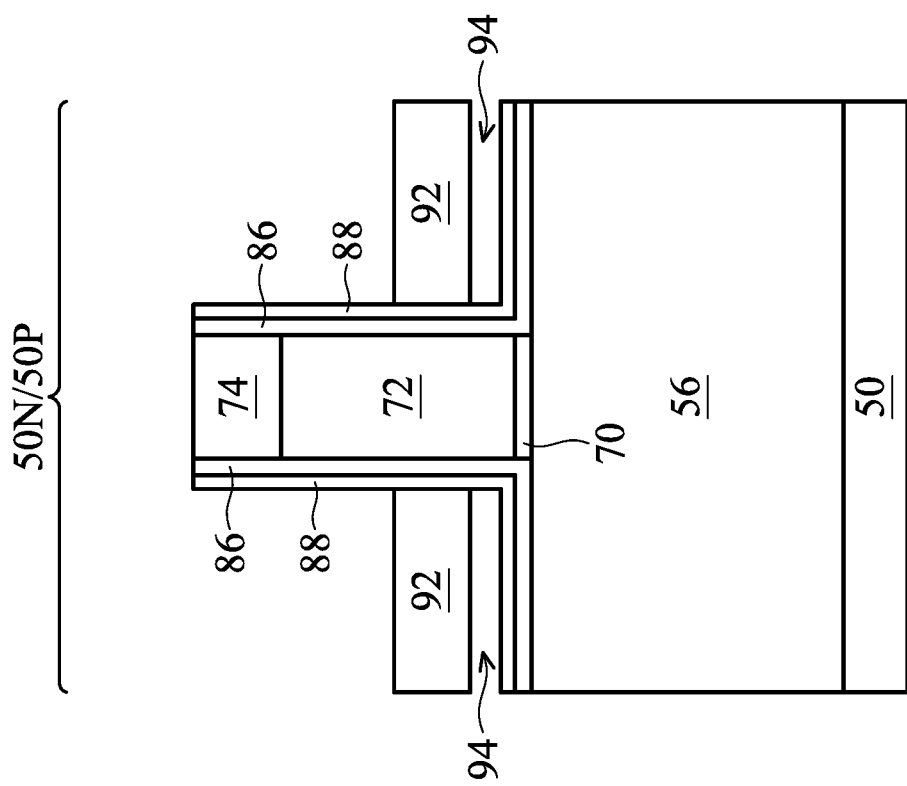
Figure 8C:
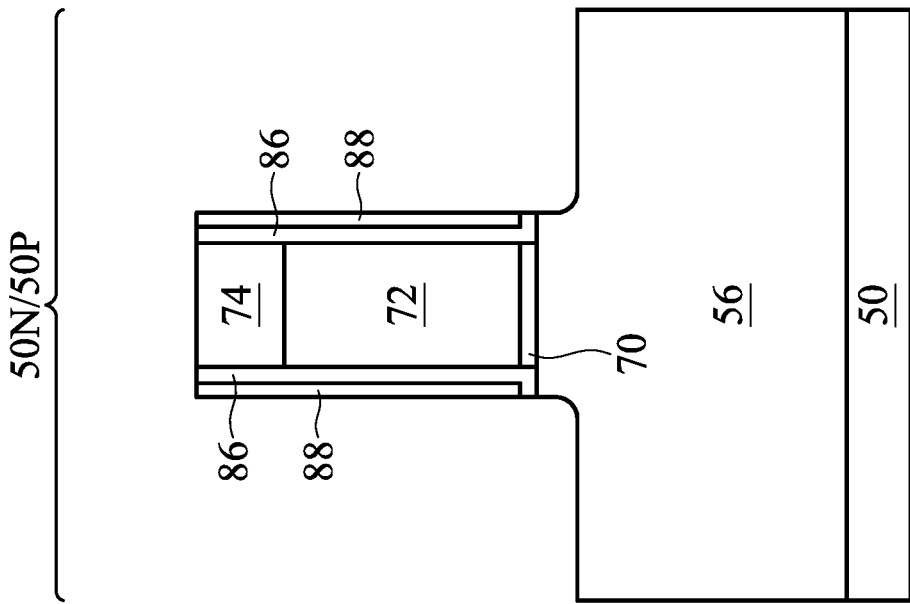
Figure 8B:
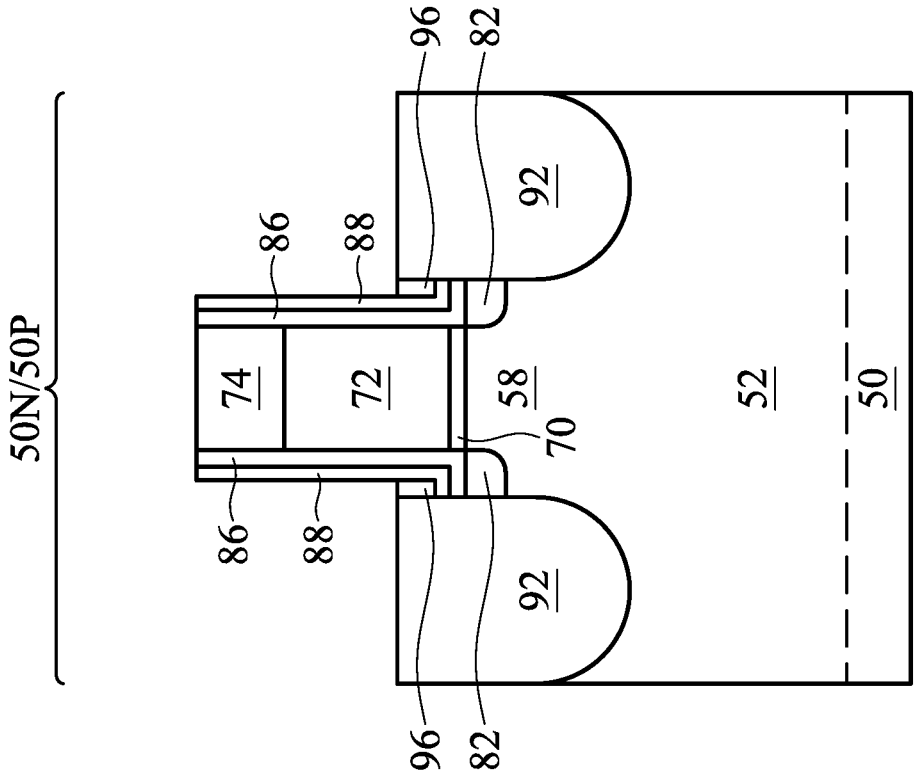
Figure 8E:
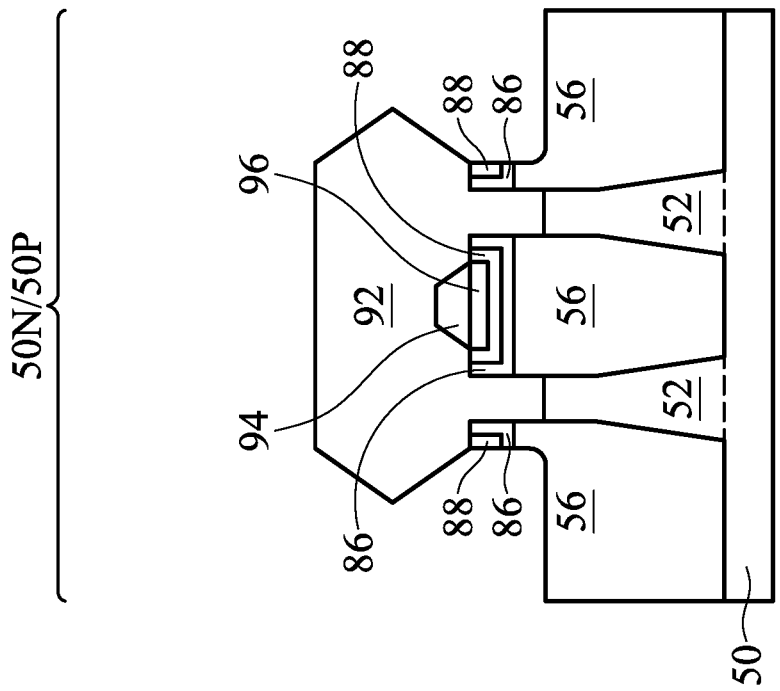
Figure 8D:
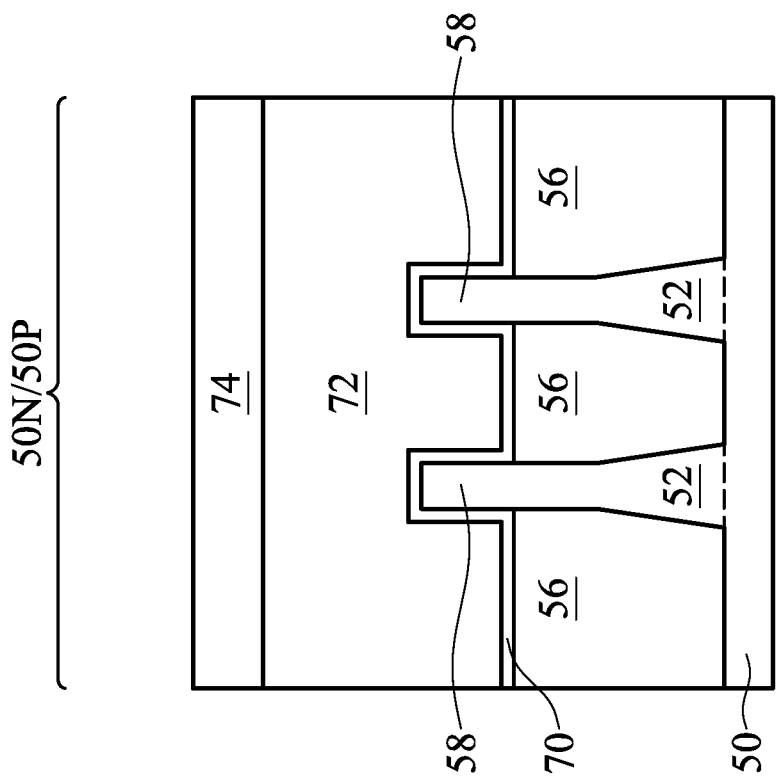
Figure 9A:
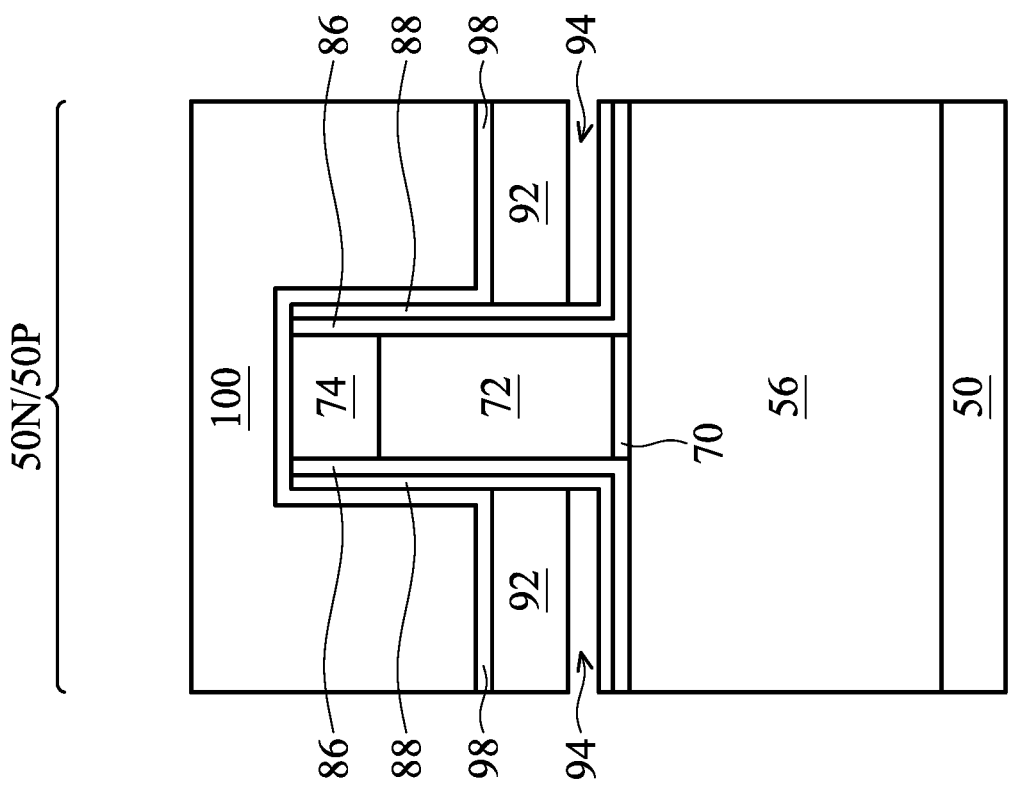
Figure 9C:
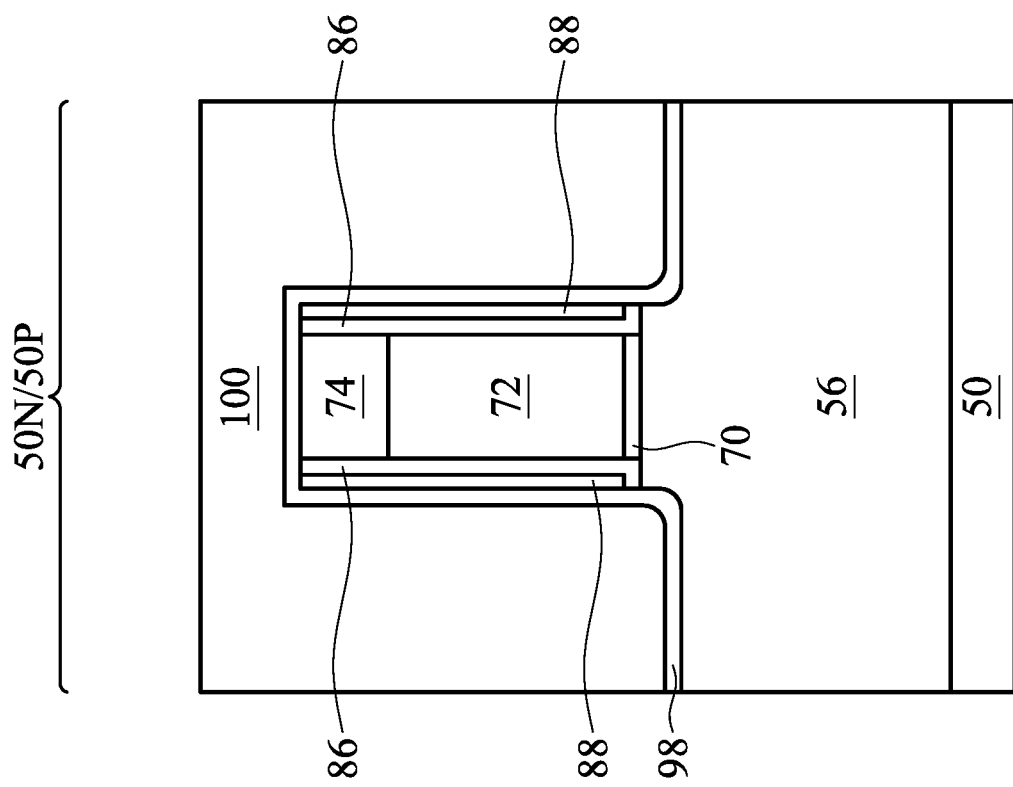
Figure 9B:
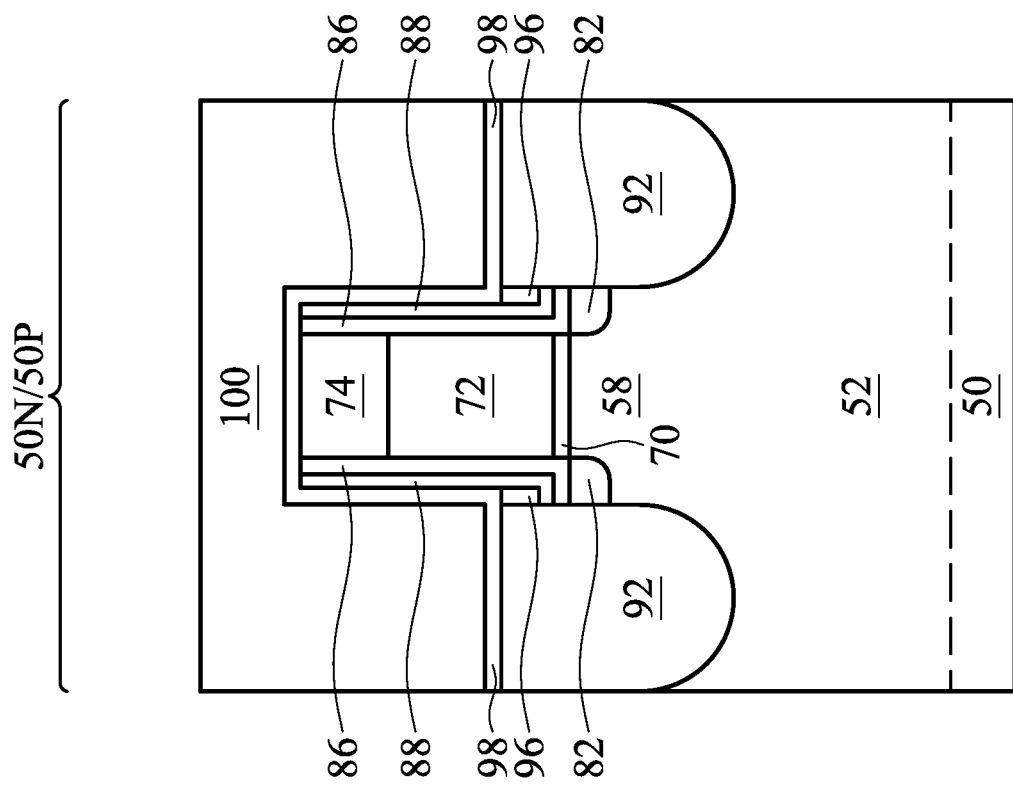
Figure 9E:
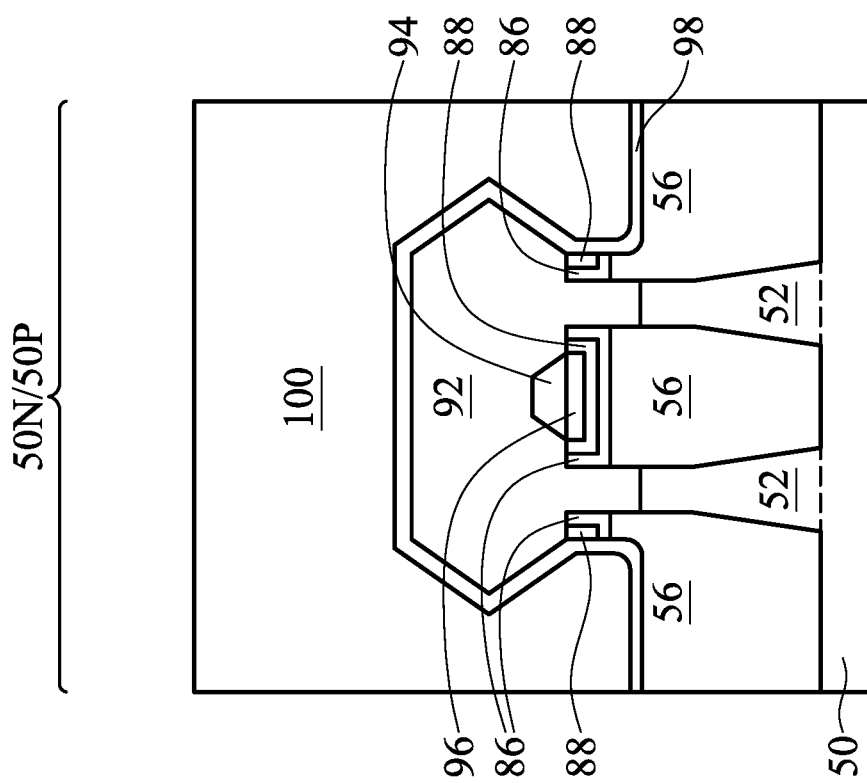
Figure 9D:
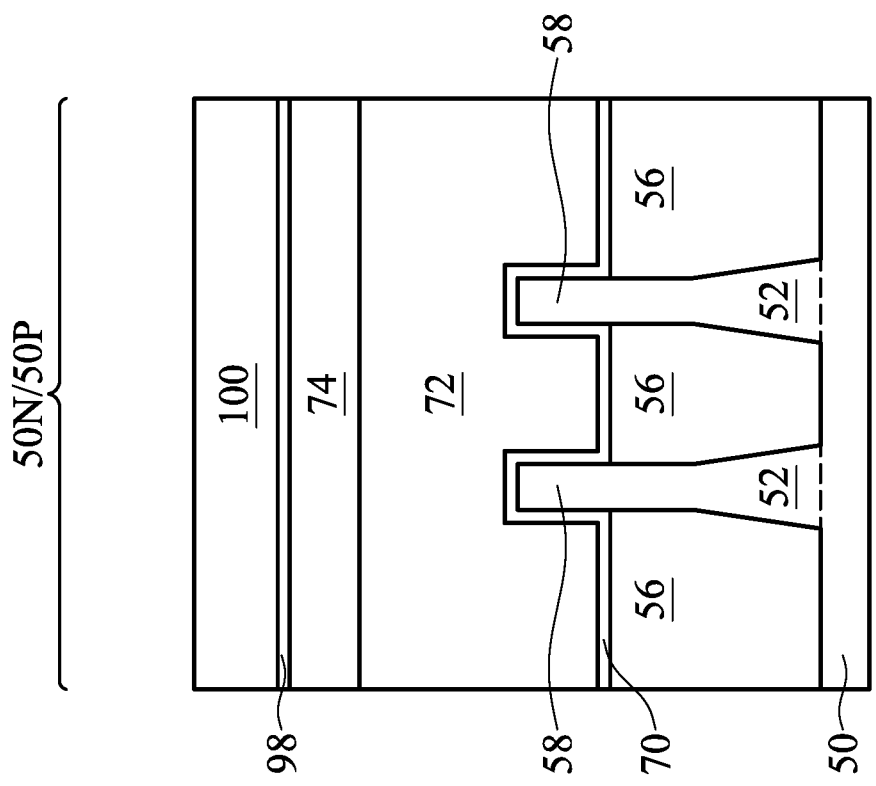
Figure 10A:
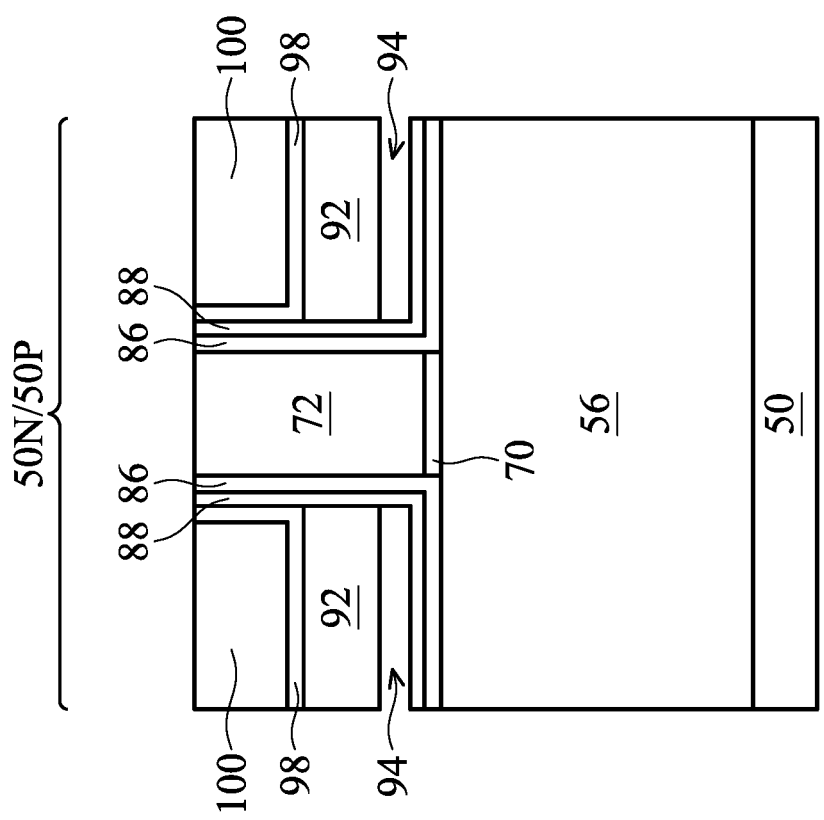
Figure 10C:
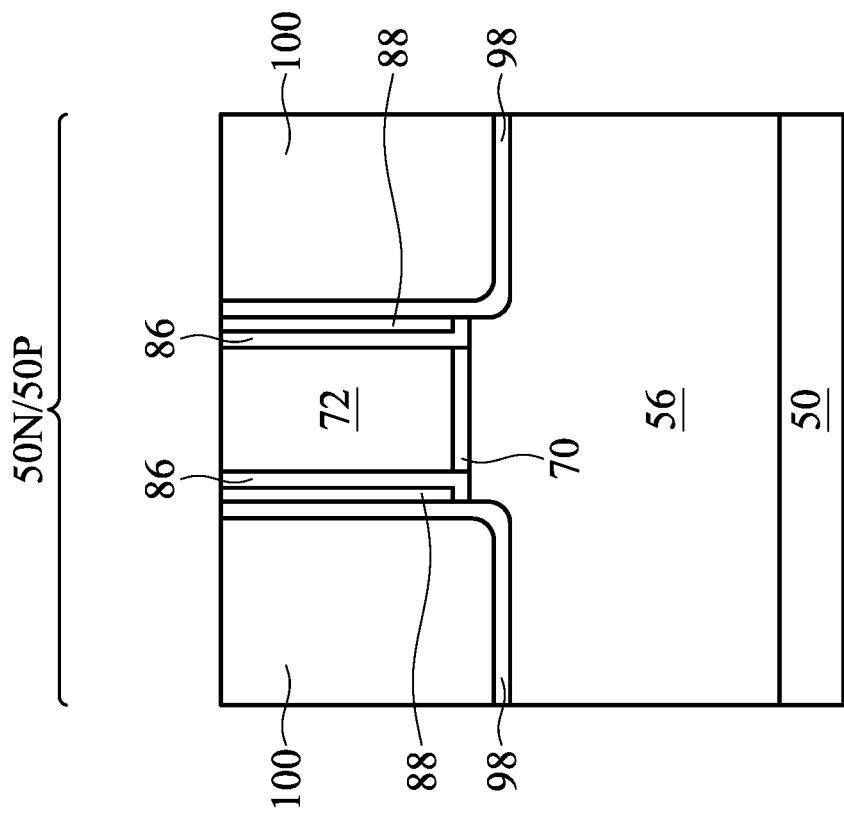
Figure 10B:
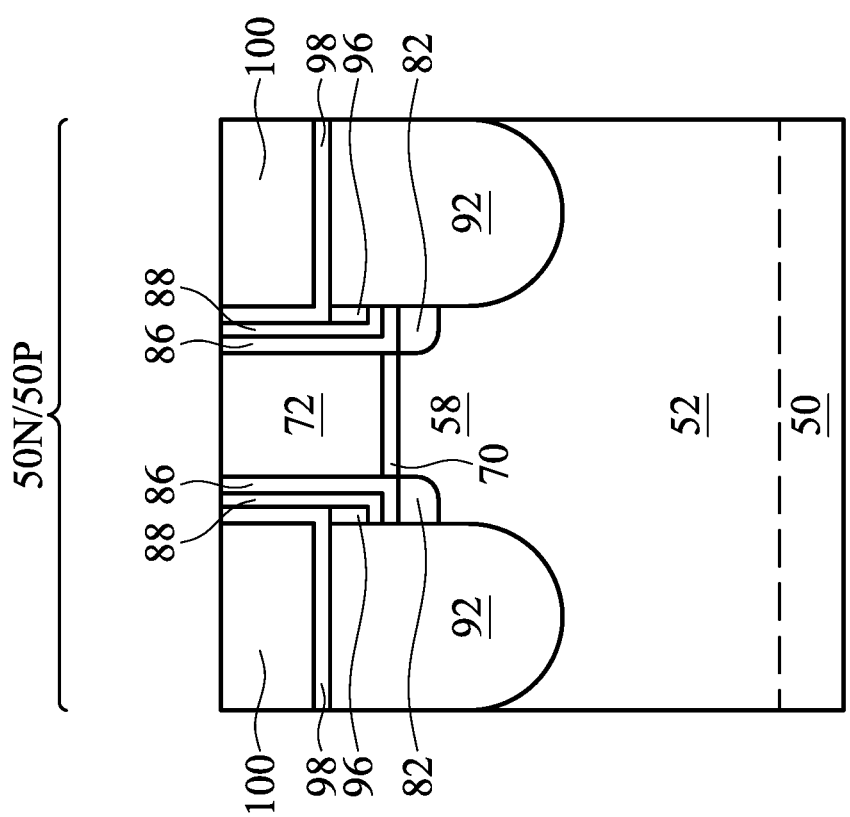
Figure 10E:
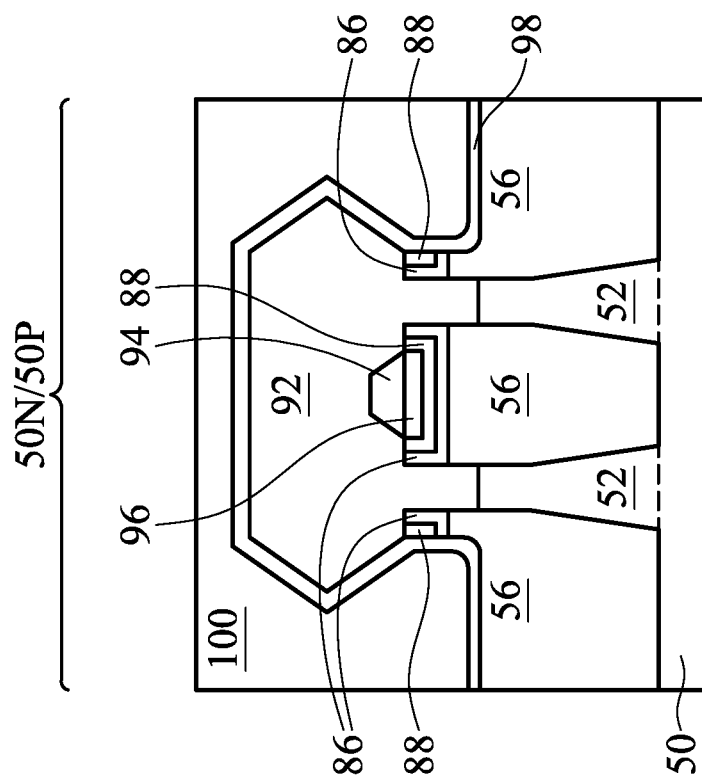
Figure 10D:
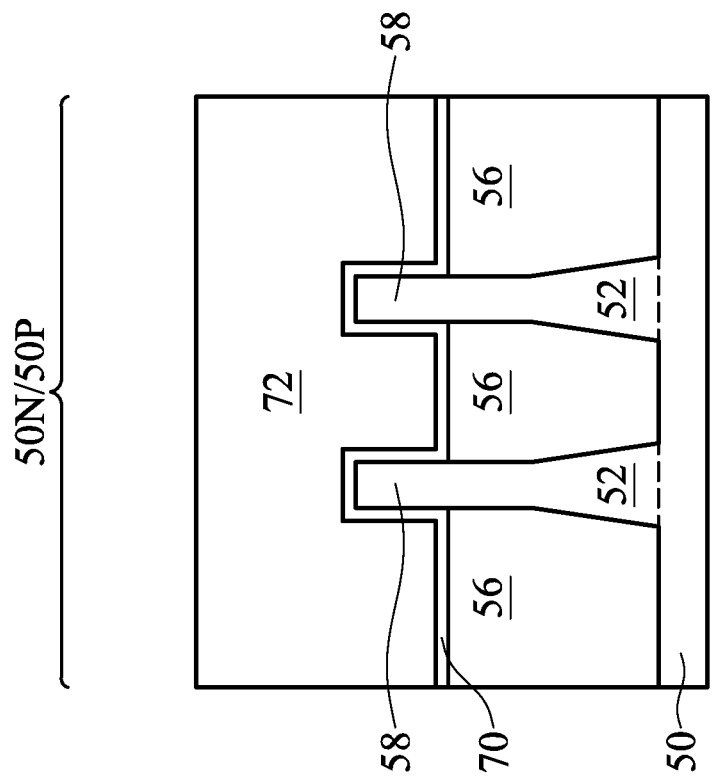
Figure 11A:
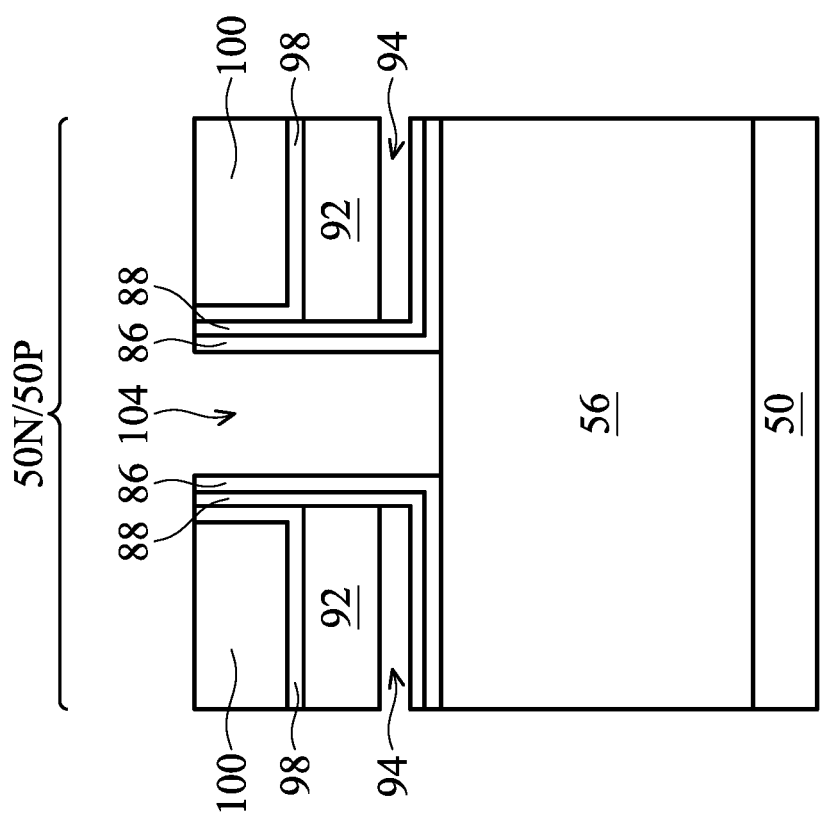
Figure 11C:
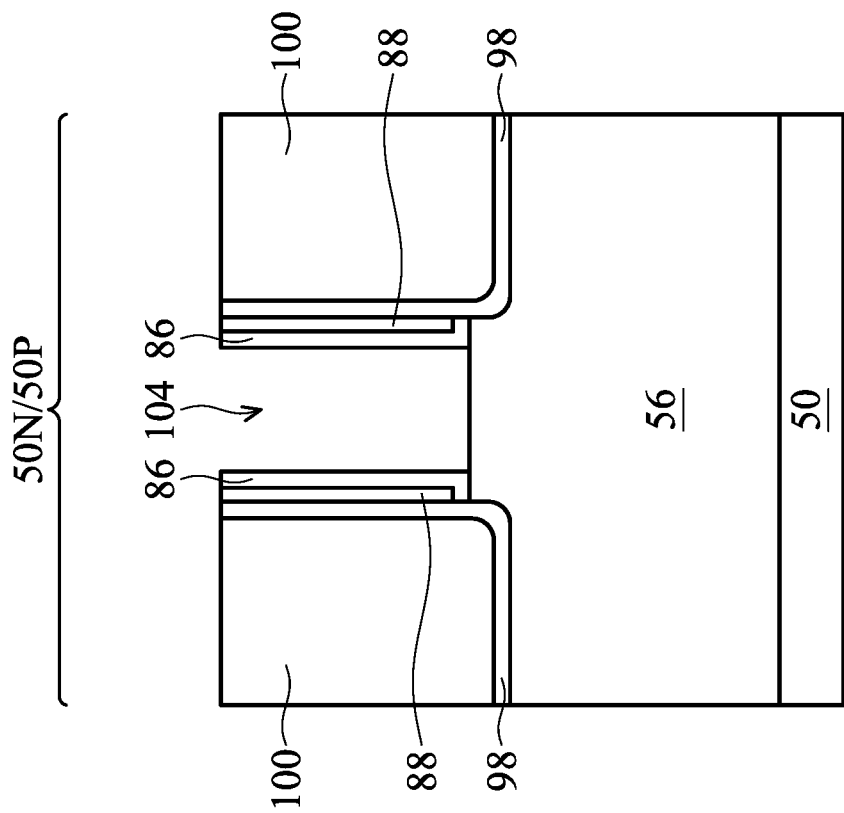
Figure 11B:
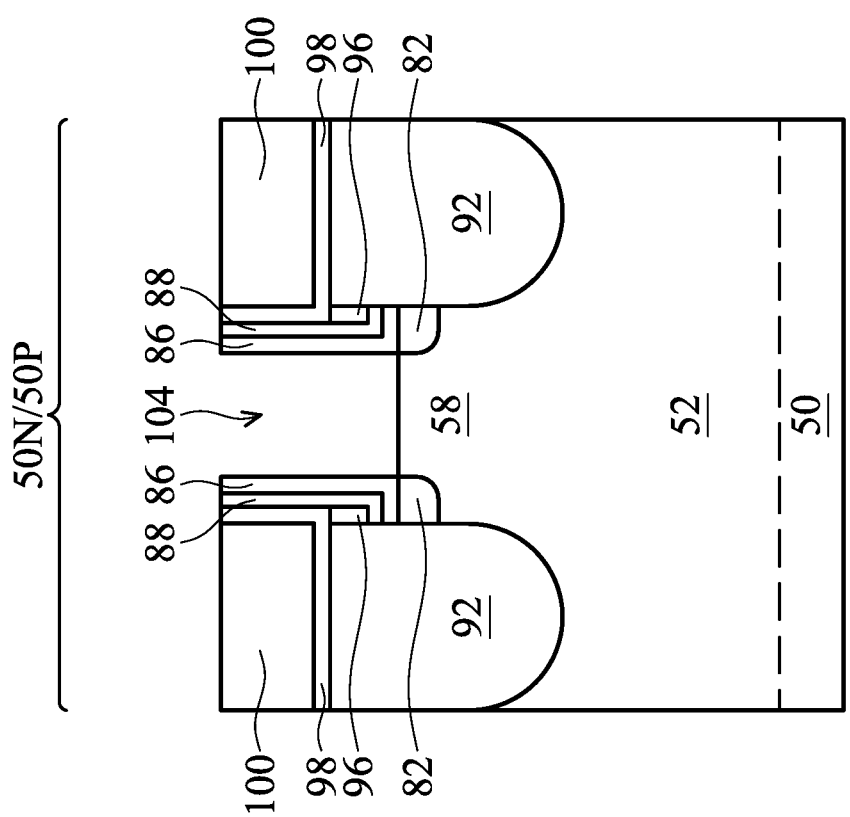
Figure 11E:
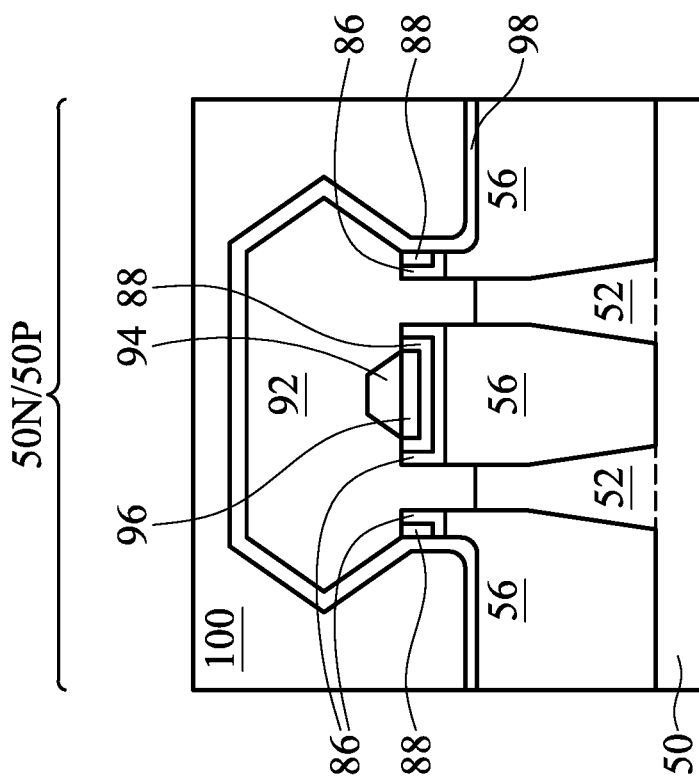
Figure 11D:
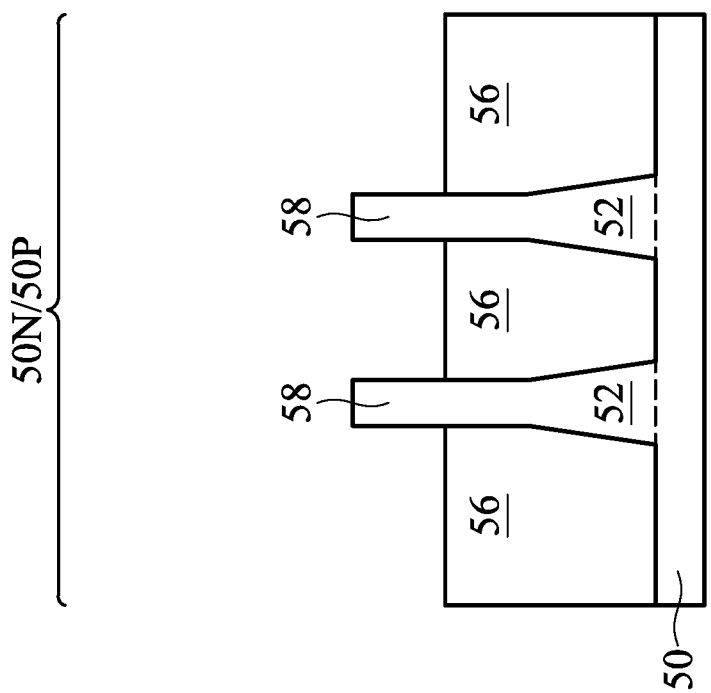

In FIG. 6, the mask layer 64 is patterned using acceptable photolithography and etching techniques to form masks 74. The pattern of the masks 74 is then transferred to the dummy gate layer 62 by an acceptable etching technique to form dummy gates 72. The pattern of the masks 74 is further transferred to the dummy dielectric layer 60 to form dummy gate dielectrics 70. The dummy gates 72 cover respective channel regions of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

FIGS. 7A through 17E are cross-sectional views of further intermediate stages in the manufacturing of FinFETs, in accordance with some embodiments. FIGS. 7A through 17E illustrate features in either of the region 50N and the region 50P. For example, the structures illustrated may be applicable to both the region 50N and the region 50P. Differences (if any) in the structures of the region 50N and the region 50P are described in the text accompanying each figure. FIGS. 7A, 8A, 9A, 10A, 11A, 12A, 13A, 14A, 15A, 16A, and 17A are illustrated along reference cross-section A-A illustrated in FIG. 1. FIGS. 7B, 8B, 9B, 10B, 11B, 12B, 13B, 14B, 15B, 16B, and 17B are illustrated along reference cross-section B-B illustrated in FIG. 1. FIGS. 7C, 8C, 9C, 10C, 11C, 12C, 13C, 14C, 15C, 16C, and 17C are illustrated along reference cross-section C-C illustrated in FIG. 1. FIGS. 7D, 8D, 9D, 10D, 11D, 12D, 13D, 14D, 15D, 16D, and 17D are illustrated along reference cross-section D-D illustrated in FIG. 1. FIGS. 7E, 8E, 9E, 10E, 11E, 12E, 13E, 14E, 15E, 16E, and 17E are illustrated along reference cross-section E-E illustrated in FIG. 1.

In FIGS. 7A through 7E, a first gate spacer layer 80 is formed on exposed surfaces of the masks 74, dummy gates 72, dummy gate dielectrics 70, STI regions 56, and/or fins 52. The first gate spacer layer 80 is formed from a dielectric material such as silicon nitride, silicon carbonitride, silicon oxycarbonitride, silicon oxycarbide, silicon, metal oxides, the like, or a combination thereof, and may be formed by a conformal deposition process such as CVD, PECVD, or the like.

After the formation of the first gate spacer layer 80, implants for lightly doped source/drain (LDD) regions 82 are performed. In the embodiments with different device types, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

After the formation of the LDD regions 82, a second gate spacer layer 84 is formed on the first gate spacer layer 80. The second gate spacer layer 84 is formed from a dielectric material such as silicon oxide, silicon oxynitride, silicon oxycarbonitride, silicon nitride, the like, or a combination thereof, and may be formed by a conformal deposition process such as CVD, PECVD, or the like. The second gate spacer layer 84 is doped, and may be doped with n-type impurities (e.g., phosphorous) or p-type impurities (e.g., boron). Notably, the second gate spacer layer 84 is a different dielectric material than the first gate spacer layer 80. The second gate spacer layer 84 and first gate spacer layer 80 have high etch selectivity relative a same etching process, e.g., the etch rate of the second gate spacer layer 84 is greater than the etch rate of the first gate spacer layer 80 during the etching process. As discussed further below, the second gate spacer layer 84 is doped in subsequent processing, which further increases the etch selectivity between the second gate spacer layer 84 and first gate spacer layer 80.

After the formation of the second gate spacer layer 84, a third gate spacer layer 90 is formed on the second gate spacer layer 84. The third gate spacer layer 90 is formed from a dielectric material selected from the candidate dielectric materials of the second gate spacer layer 84, and may be formed by a method selected from the candidate methods of forming the second gate spacer layer 84, or may be formed by a different method. In some embodiments, the third gate spacer layer 90 is formed of a different material than the second gate spacer layer 84.

In a particular embodiment, the third gate spacer layer 90 is formed from the same dielectric material as the second gate spacer layer 84, such that the third gate spacer layer 90 also has a high etch selectivity with the first gate spacer layer 80. As discussed further below, the third gate spacer layer 90 is also doped in subsequent processing, which further increases the etch selectivity between the third gate spacer layer 90 and first gate spacer layer 80.

In FIGS. 8A through 8E, epitaxial source/drain regions 92 are formed in the fins 52 to exert stress in the respective channel regions 58, thereby improving performance. The epitaxial source/drain regions 92 are formed in the fins 52 such that each dummy gate 72 is disposed between respective neighboring pairs of the epitaxial source/drain regions 92. In some embodiments the epitaxial source/drain regions 92 may extend into, and may also penetrate through, the fins 52. The first gate spacer layer 80, second gate spacer layer 84, and third gate spacer layer 90 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 92 in the region 50N are epitaxially grown in the recesses. The epitaxial source/drain regions 92 may include any acceptable material, such as appropriate for n-type FinFETs. For example, if the fin 52 is silicon, the epitaxial source/drain regions 92 in the region 50N may include materials exerting a tensile strain in the channel region 58, such as silicon, SiC, SiCP, SiP, or the like. The epitaxial source/drain regions 92 in the region 50N may have surfaces raised from respective surfaces of the fins 52 and may have facets.

The epitaxial source/drain regions 92 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 92 in the region 50P are epitaxially grown in the recesses. The epitaxial source/drain regions 92 may include any acceptable material, such as appropriate for p-type FinFETs. For example, if the fin 52 is silicon, the epitaxial source/drain regions 92 in the region 50P may comprise materials exerting a compressive strain in the channel region 58, such as SiGe, SiGeB, Ge, GeSn, or the like. The epitaxial source/drain regions 92 in the region 50P may also have surfaces raised from respective surfaces of the fins 52 and may have facets.

In some embodiments, the third gate spacer layer 90 is formed during the process for forming the epitaxial source/drain regions 92, and a third gate spacer layer 90 may be formed in each region. For example, a third gate spacer layer 90 may be formed with the epitaxial source/drain regions 92 in the region 50N, while the region 50P is masked, and a third gate spacer layer 90 may be formed with the epitaxial source/drain regions 92 in the region 50P, while the region 50N is masked. The third gate spacer layer 90 acts as an additional etching mask during the recessing of the source/drain regions of the fins 52, protecting vertical portions of the second gate spacer layer 84 during the etching of the source/drain regions of the fins 52. The source/drain recesses may thus be formed to a greater depth and narrower width.

During the recessing of the source/drain regions of the fins 52, the first gate spacer layer 80, second gate spacer layer 84, and third gate spacer layer 90 are etched. Openings are formed in the first gate spacer layer 80, second gate spacer layer 84, and third gate spacer layer 90, exposing the source/drain regions of the fins 52, and the openings are extended into the fins 52 to form the recesses for the epitaxial source/drain regions 92. The etching may be, e.g., an anisotropic etching, such as a dry etch. The first gate spacer layer 80, second gate spacer layer 84, and third gate spacer layer 90 may (or may not) be etched in different processes.

The epitaxial source/drain regions 92 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions have facets which expand laterally outward beyond sidewalls of the fins 52. In some embodiments, these facets cause adjacent epitaxial source/drain regions 92 of a same FinFET to merge as illustrated. Voids 94 are formed beneath the merged epitaxial source/drain regions 92, between adjacent fins 52. Two or more adjacent regions may merge. In other embodiments (discussed further below), adjacent epitaxial source/drain regions 92 remain separated after the epitaxy process is completed.

During doping of the epitaxial source/drain regions 92, the first gate spacer layer 80, second gate spacer layer 84, and third gate spacer layer 90 may also be doped. For example, when the doping is by implantation, some impurities may be implanted in the various spacers. Likewise, when the doping is performed in situ during growth, the various spacers may be exposed to the dopant precursors of the epitaxy process. Because the third gate spacer layer 90 covers the second gate spacer layer 84, the second gate spacer layer 84 may have a lower dopant concentration than the third gate spacer layer 90. Likewise, because the second gate spacer layer 84 covers the first gate spacer layer 80, the first gate spacer layer 80 may have a lower dopant concentration than the second gate spacer layer 84. Further, some regions (e.g., upper regions) of the first gate spacer layer 80, second gate spacer layer 84, and third gate spacer layer 90 may be doped to a higher impurity concentration than other regions (e.g., lower regions) of the spacer layers. Due to the masking steps discussed above, the first gate spacer layer 80, second gate spacer layer 84, and third gate spacer layer 90 in the region 50N are doped with the same impurities as the epitaxial source/drain regions 92 in the region 50N. Likewise, the first gate spacer layer 80, second gate spacer layer 84, and third gate spacer layer 90 in the region 50P are doped with the same impurities as the epitaxial source/drain regions 92 in the region 50P. As such, the conductivity type (e.g., majority carrier type) of each epitaxial source/drain region 92 is the same as the portions of the first gate spacer layer 80, second gate spacer layer 84, and third gate spacer layer 90 adjacent the epitaxial source/drain region 92.

After the epitaxial source/drain regions 92 are formed, remaining portions of the first gate spacer layer 80 and second gate spacer layer 84, respectively, form first gate spacers 86 and second gate spacers 88. Further, the third gate spacer layer 90 is partially removed. The removal may be by an appropriate etching process, such as a wet etch using hot $H_3PO_4$ acid. In some embodiments, residual portions of the third gate spacer layer 90 remain after the removal, with the residual portions being disposed between the second gate spacers 88 and the raised surfaces of the epitaxial source/drain regions 92, and in the voids 94 of the epitaxial source/drain regions 92. The residual portions of the third gate spacer layer 90 are referred to as residual spacers 96.

In FIGS. 9A through 9E, a contact etch stop layer (CESL) 98 is formed along the second gate spacers 88, and over the epitaxial source/drain regions 92 and residual spacers 96. The CESL 98 may be formed from a dielectric material selected from the candidate dielectric materials of the first gate spacer layer 80, or may include a different dielectric material. The CESL 98 may be formed by a method selected from the candidate methods of forming the first gate spacer layer 80, or may be formed by a different method. Notably, the CESL 98 is a different dielectric material than the second gate spacer layer 84. The second gate spacer layer 84 and CESL 98 have high etch selectivity relative a same etching process, e.g., the etch rate of the second gate spacer layer 84 is greater than the etch rate of the CESL 98 during the etching process. In some embodiments, the CESL 98 and first gate spacer layer 80 are formed from the same dielectric material.

Further, a first inter-layer dielectric (ILD) 100 is deposited over the CESL 98. The first ILD 100 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

In FIGS. 10A through 10E, a planarization process, such as a CMP, may be performed to level the top surface of the first ILD 100 with the top surfaces of the dummy gates 72 or the masks 74. The planarization process removes portions of the CESL 98 over the masks 74, and may also remove the masks 74 on the dummy gates 72. After the planarization process, top surfaces of the dummy gates 72, first gate spacers 86, second gate spacers 88, CESL 98, and first ILD 100 are level. Accordingly, the top surfaces of the dummy gates 72 are exposed through the first ILD 100. In some embodiments, the masks 74 may remain, in which case the planarization process levels the top surface of the first ILD 100 with the top surfaces of the masks 74.

In FIGS. 11A through 11E, the dummy gates 72, and the masks 74 if present, are removed in an etching step(s), so that recesses 104 are formed. The dummy gate dielectrics 70 in the recesses 104 may also be removed. In some embodiments, only the dummy gates 72 are removed and the dummy gate dielectrics 70 remain and are exposed by the recesses 104. In some embodiments, the dummy gate dielectrics 70 are removed from recesses 104 in a first region of a die (e.g., a core logic region) and remains in recesses 104 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first gate spacers 86, second gate spacers 88, CESL 98, or first ILD 100. Each recess 104 exposes a channel region 58 of a respective fin 52. Each channel region 58 is disposed between neighboring pairs of the epitaxial source/drain regions 92. During the removal, the dummy gate dielectrics 70 may be used as etch stop layers when the dummy gates 72 are etched. The dummy gate dielectrics 70 may then be optionally removed after the removal of the dummy gates 72.

Figure 12A:
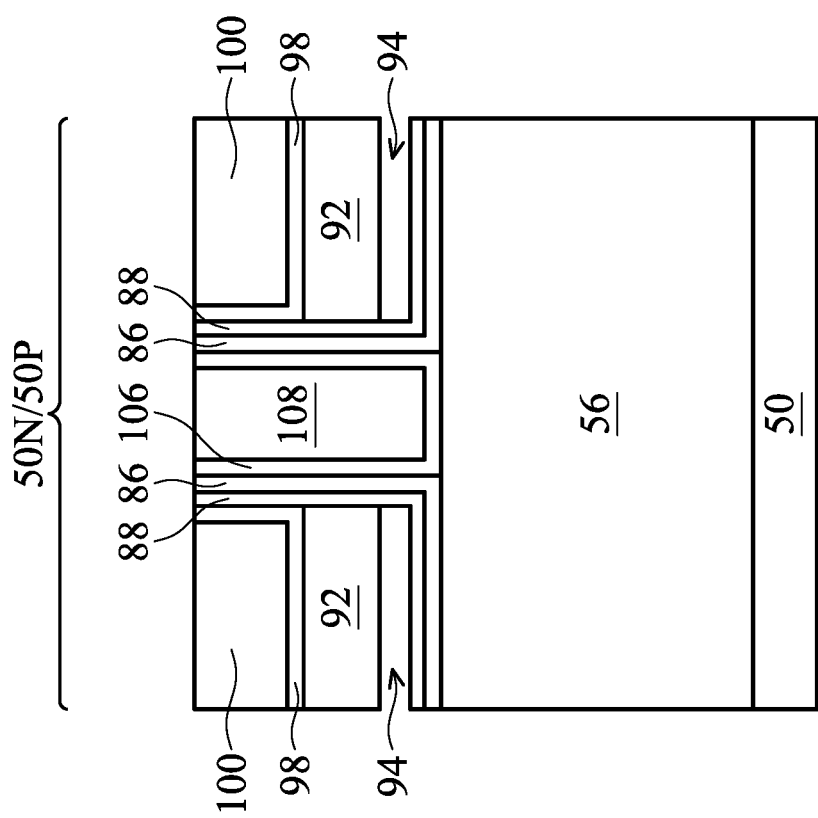
Figure 12C:
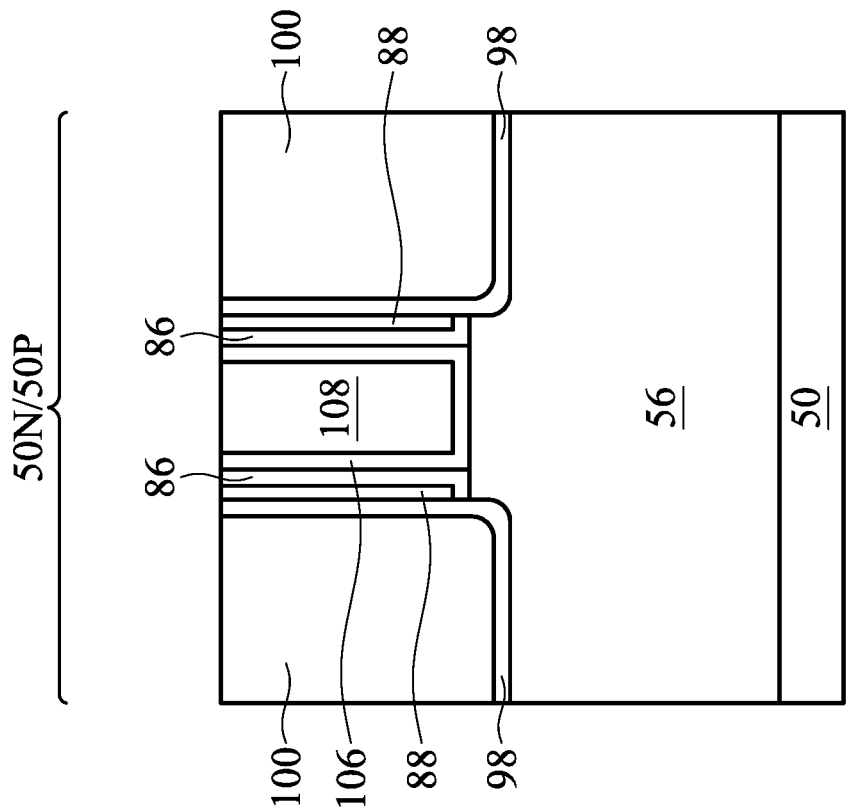
Figure 12B:
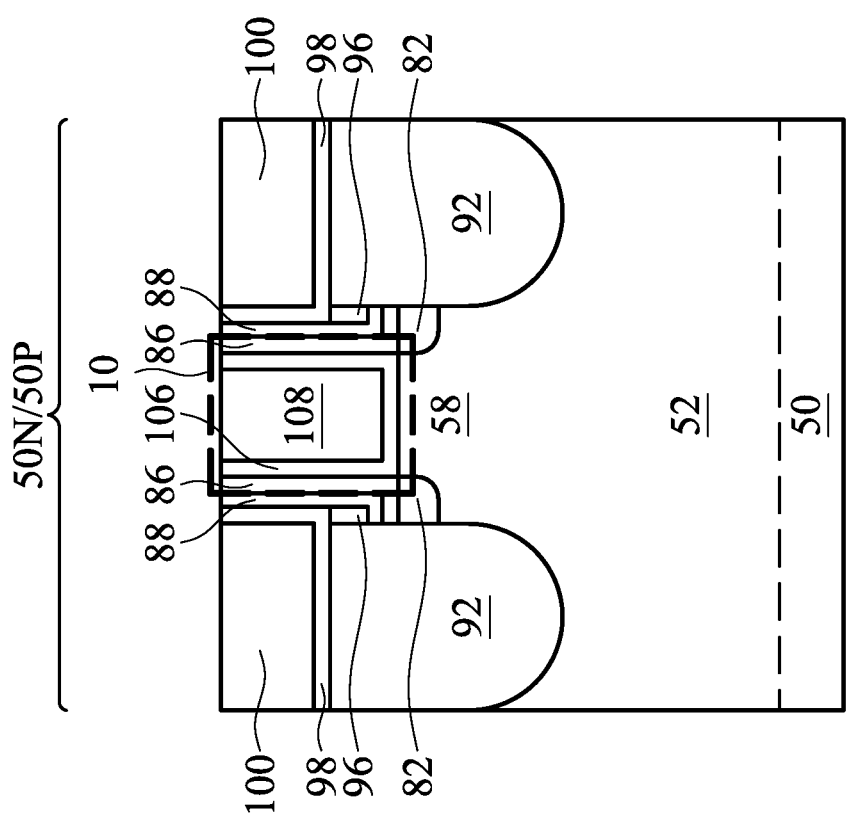
Figure 12E:
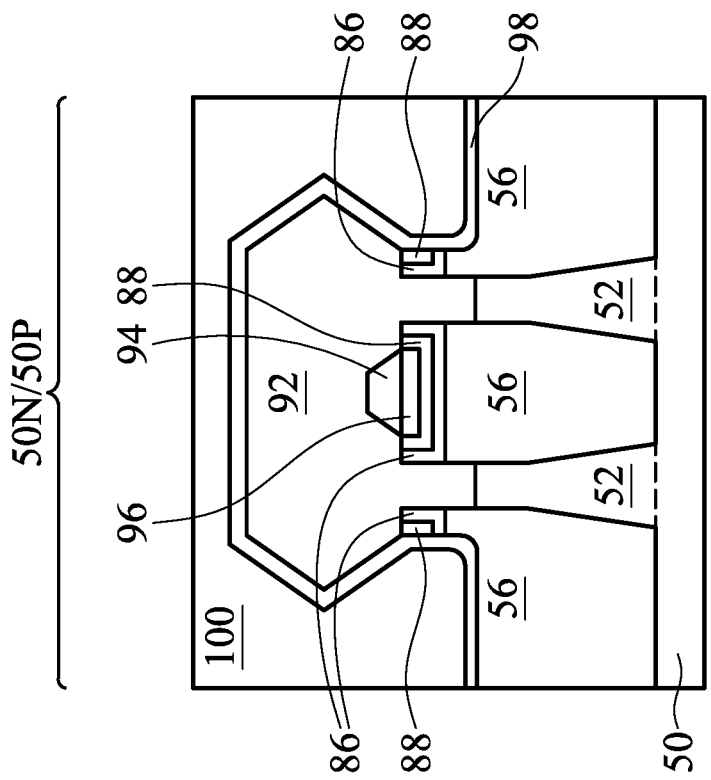
Figure 12D:
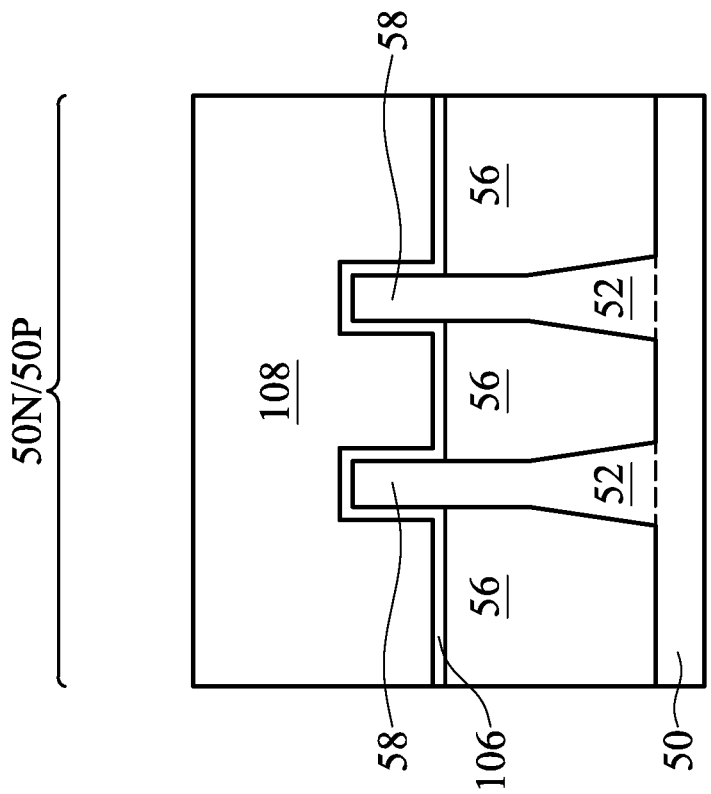
Figure 12F:
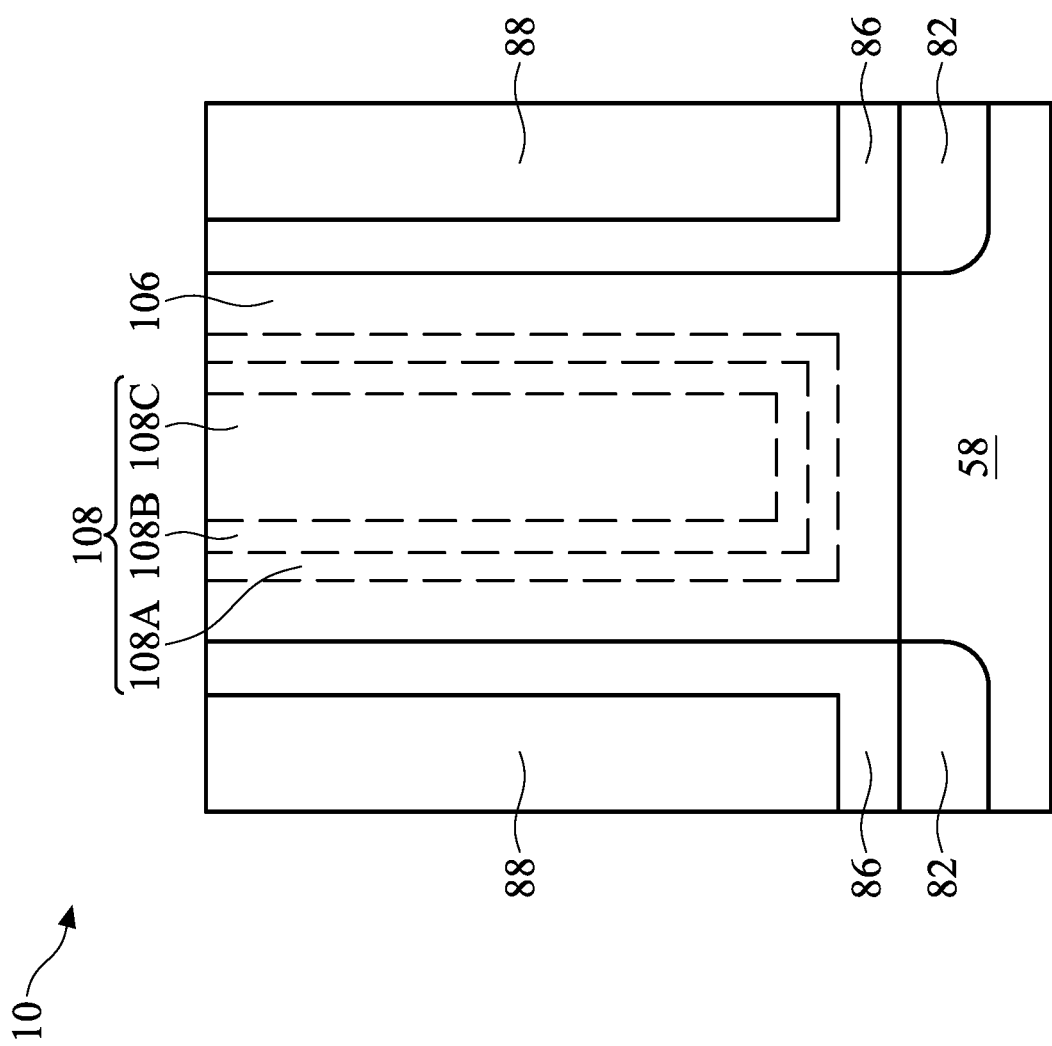
Figure 13A:
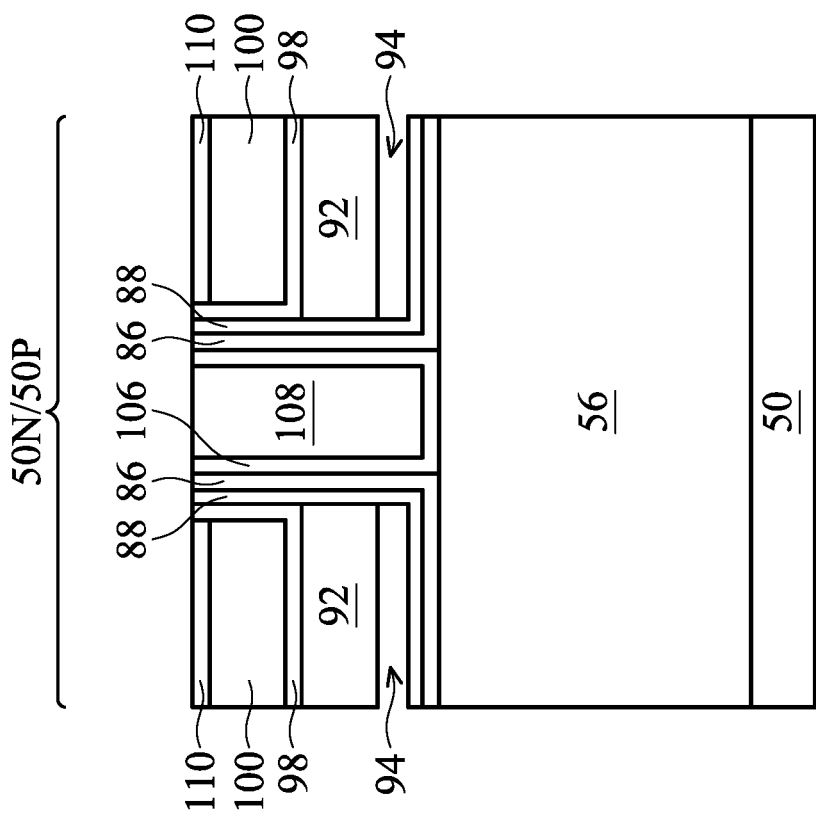
Figure 13C:
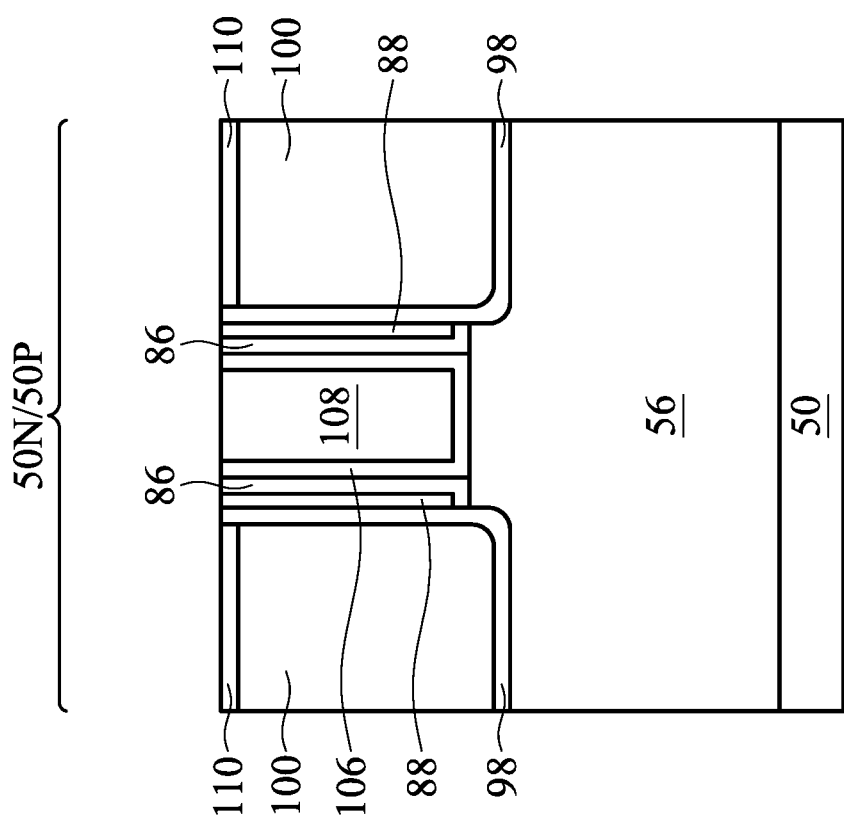
Figure 13B:
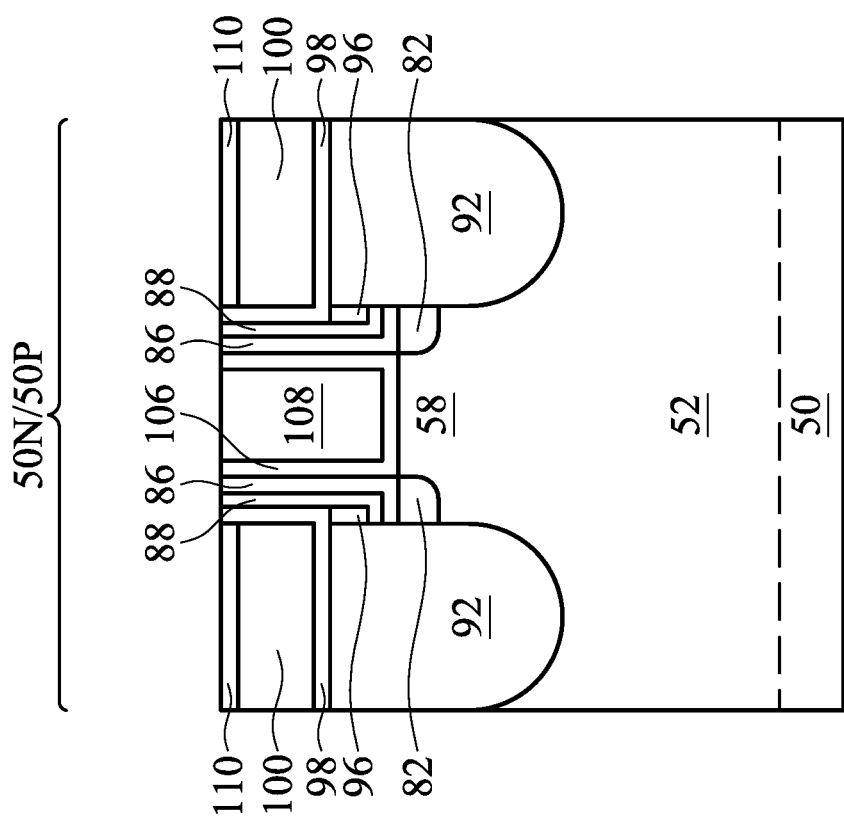
Figure 13E:
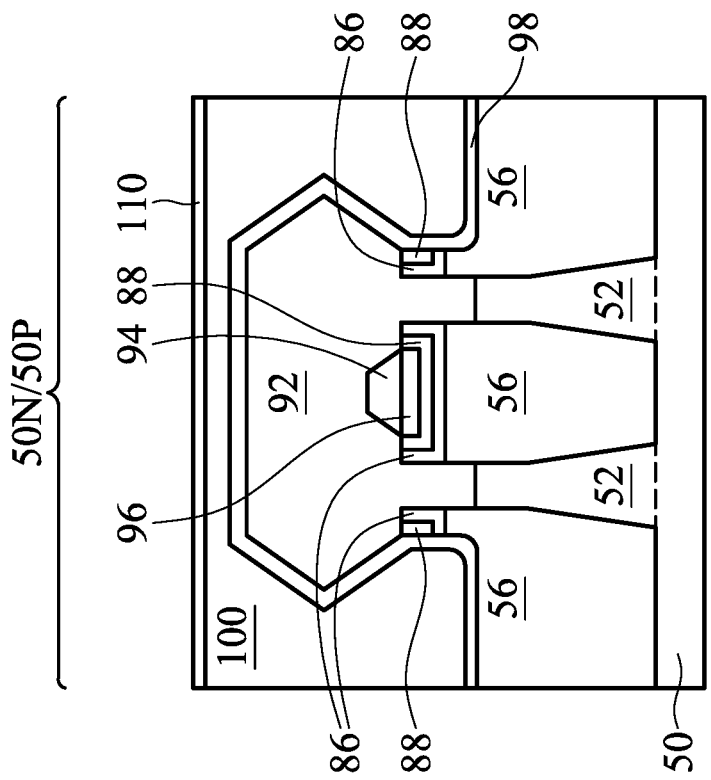
Figure 13D:
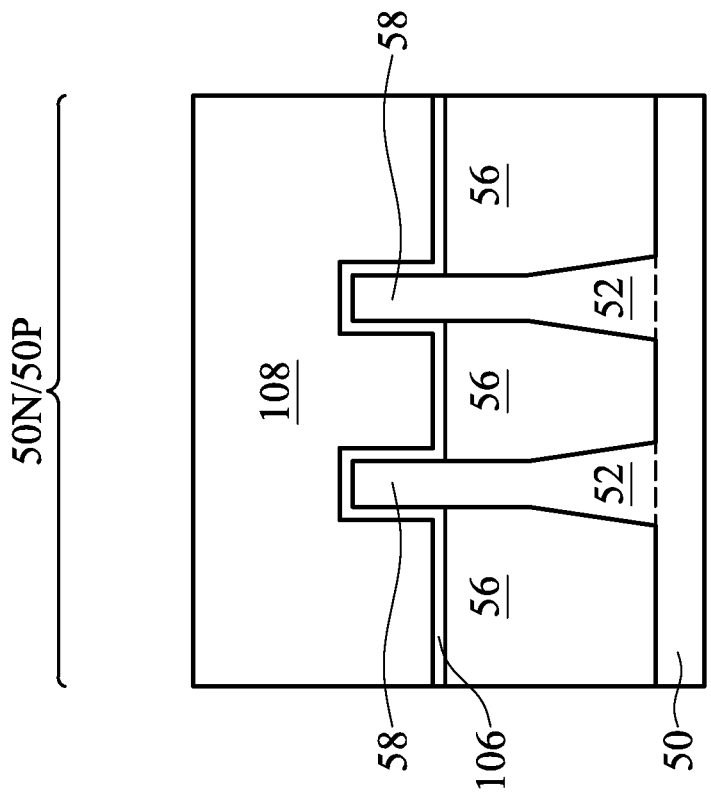
Figure 14A:
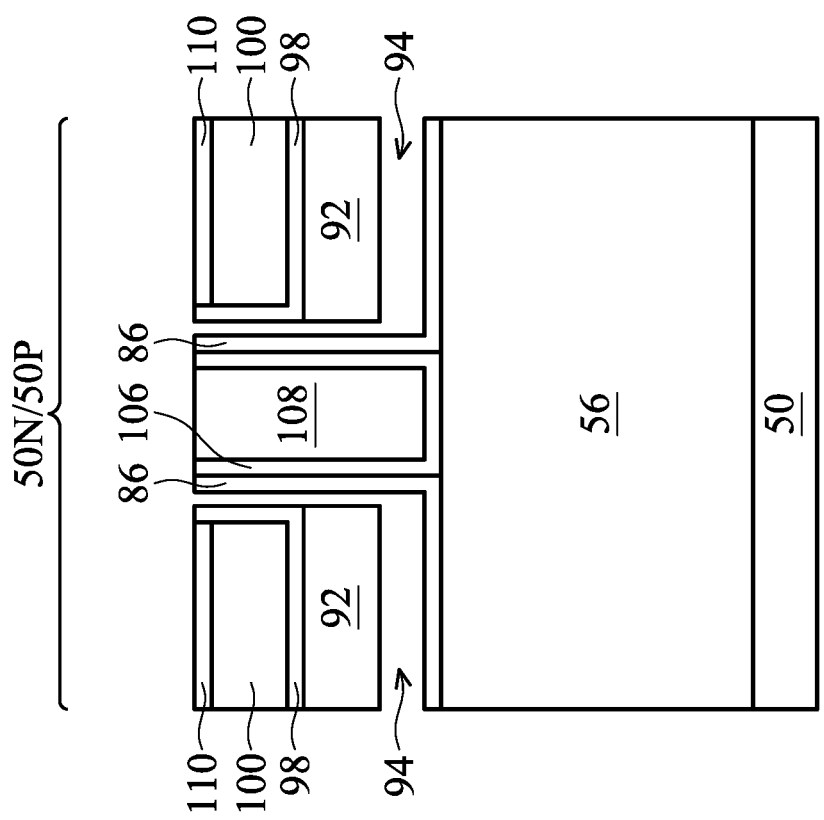
Figure 14C:
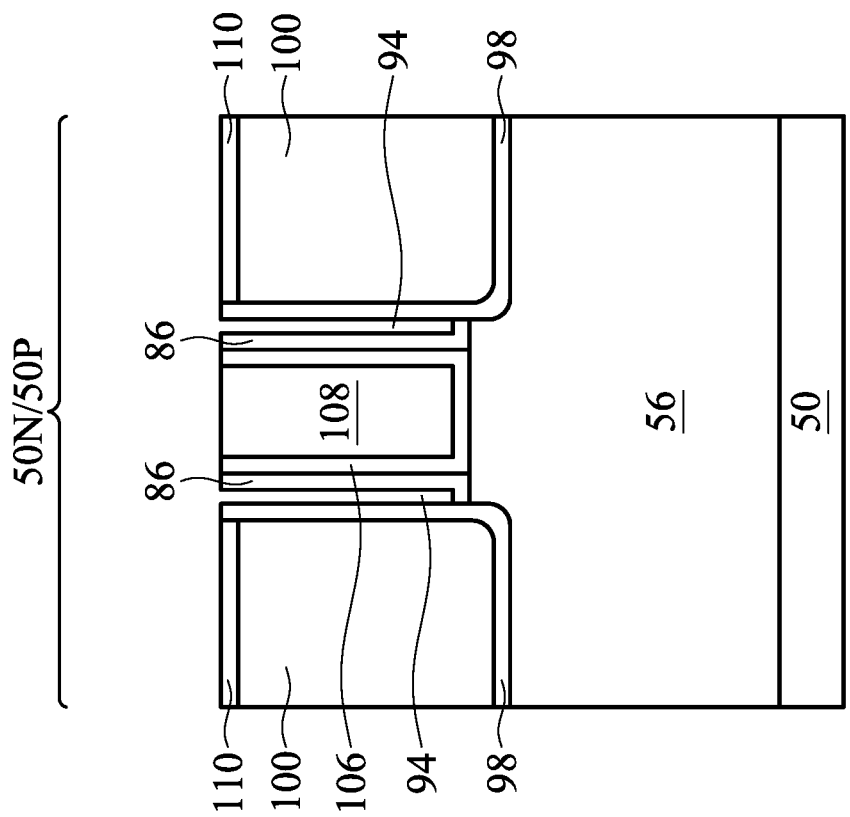
Figure 14B:
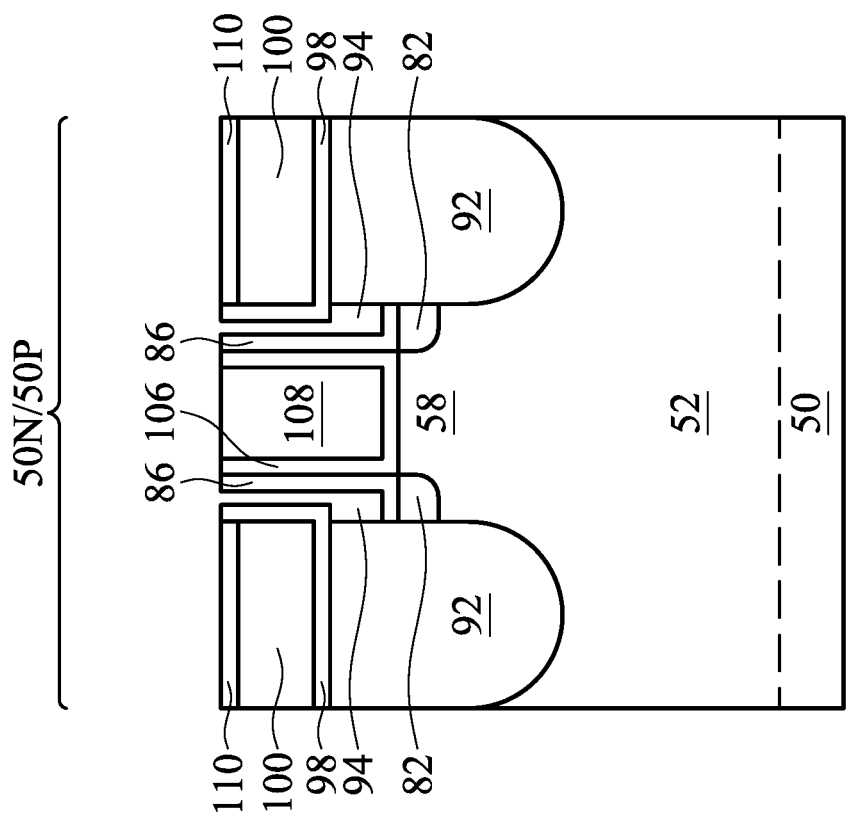
Figure 14E:
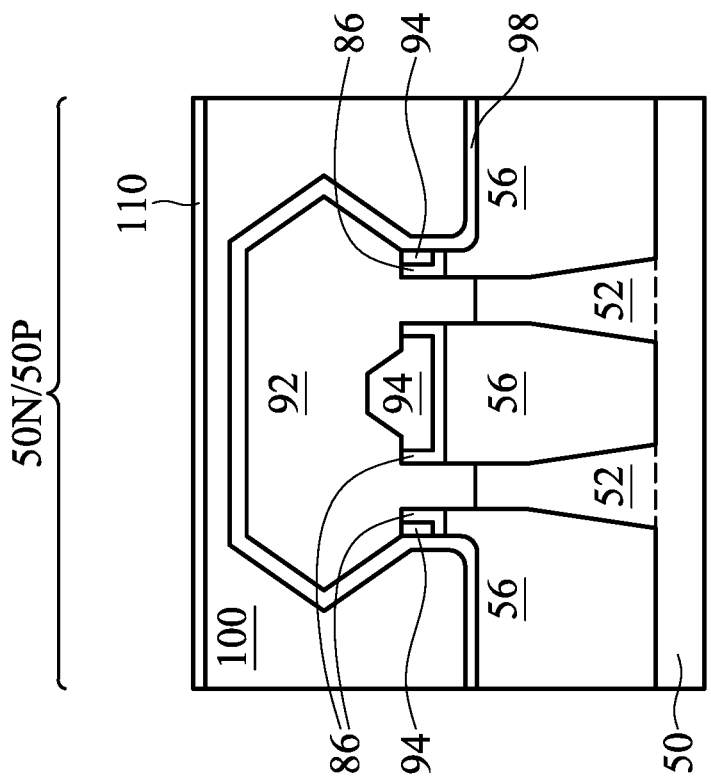
Figure 14D:
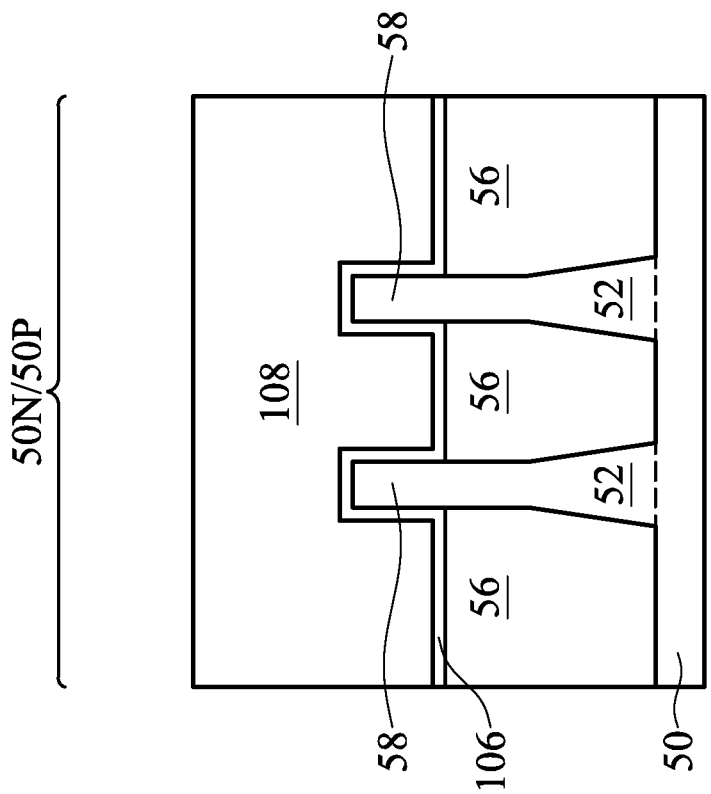
Figure 15A:
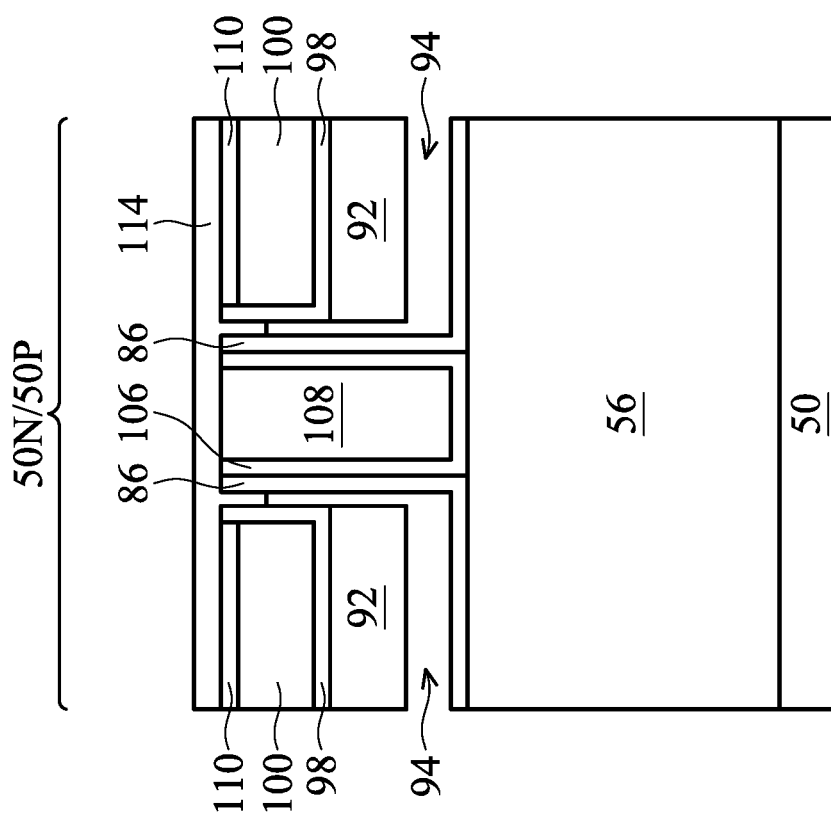
Figure 15C:
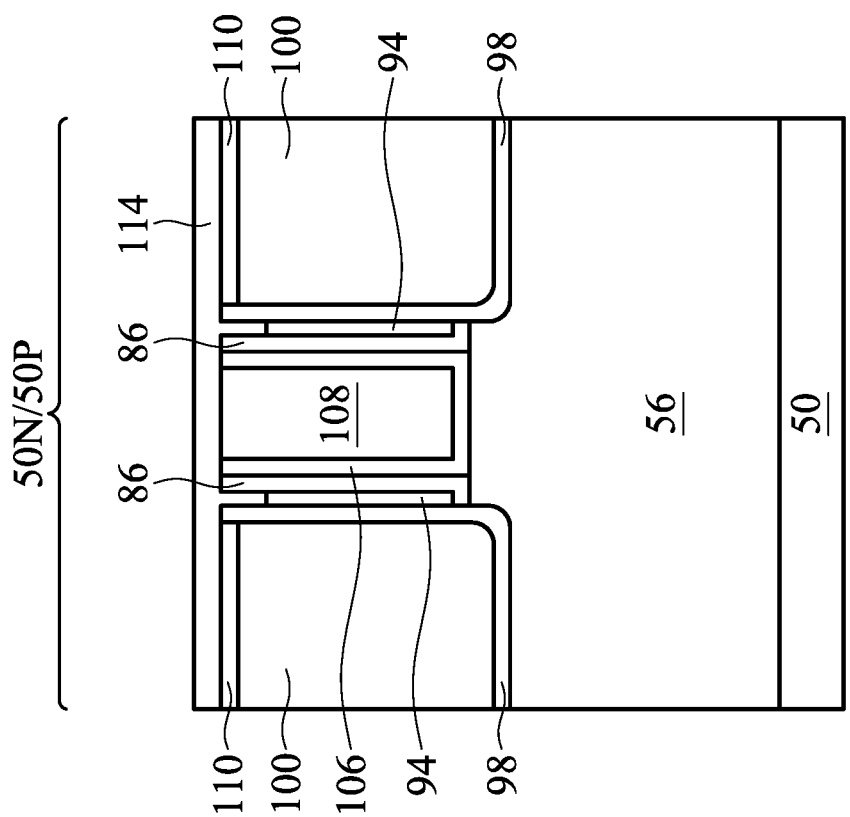
Figure 15B:
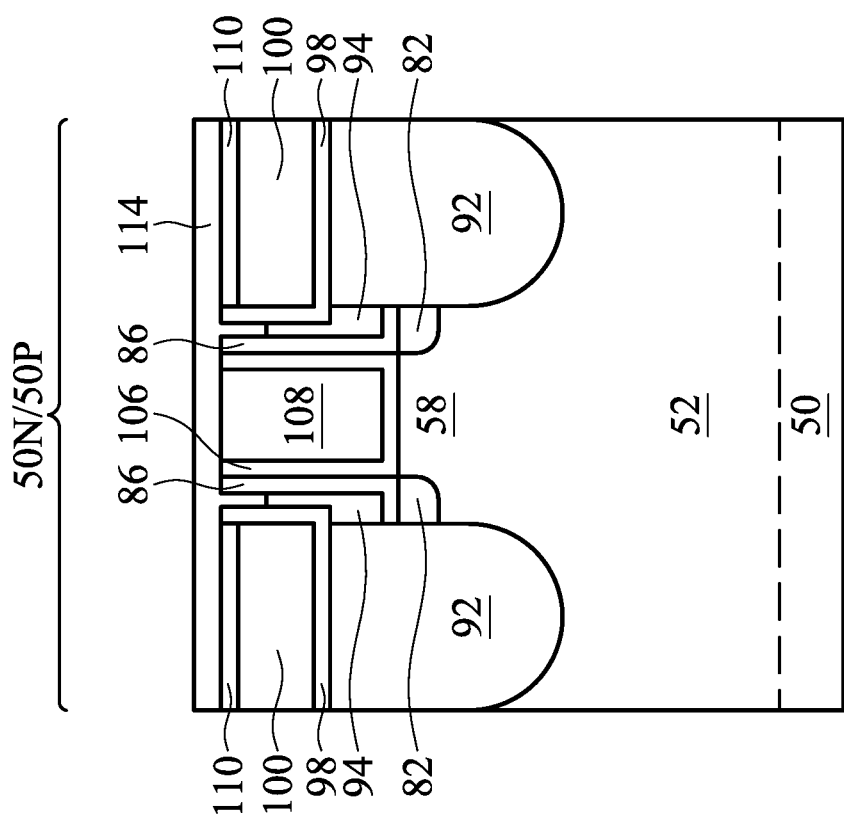
Figure 15E:
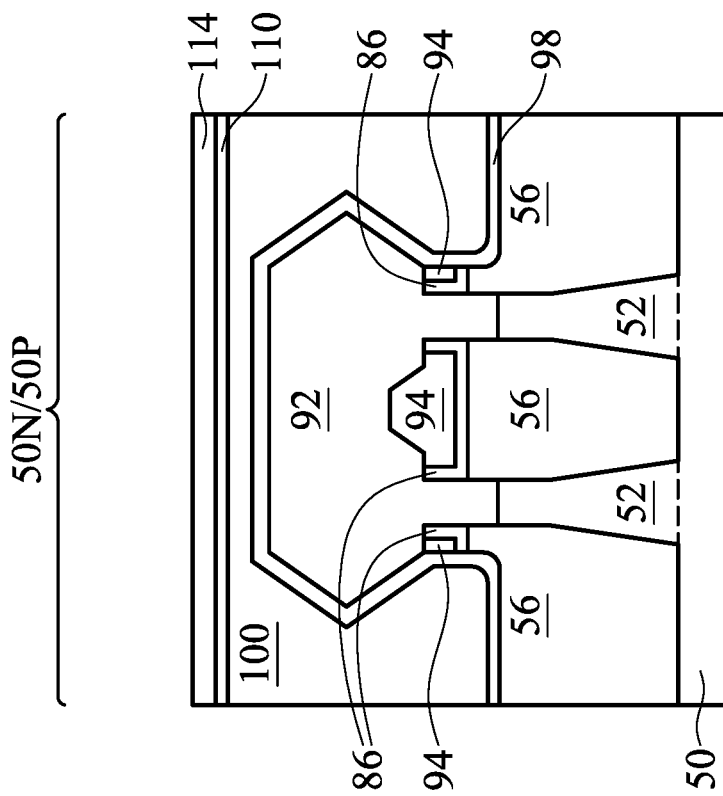
Figure 15D:
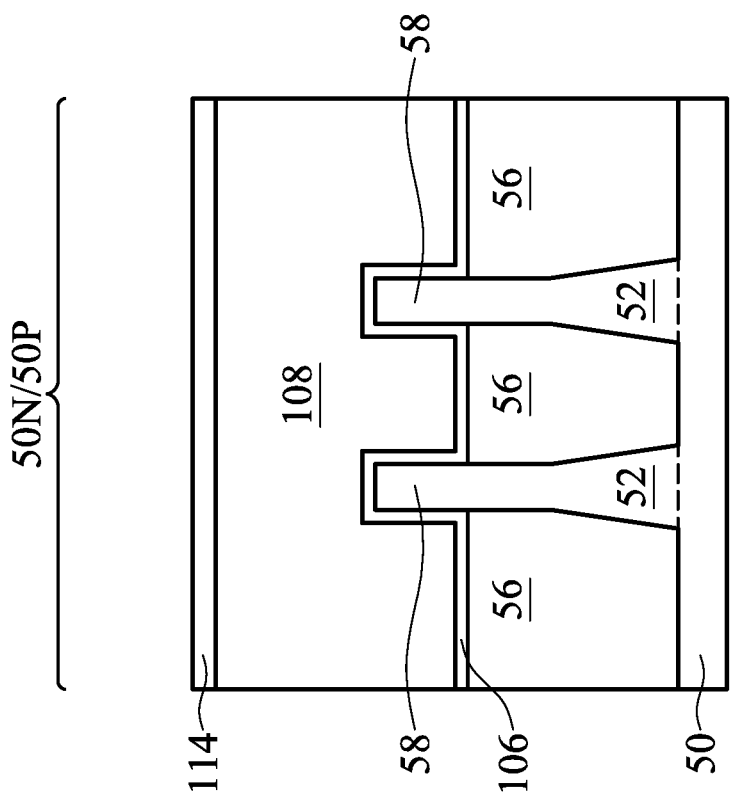
Figure 16A:
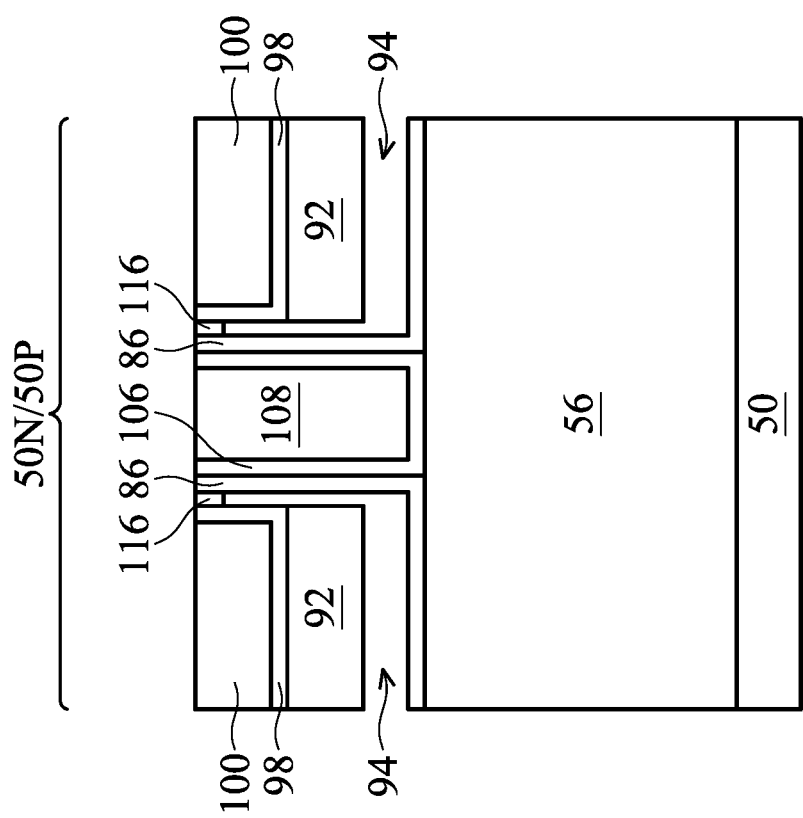
Figure 16C:
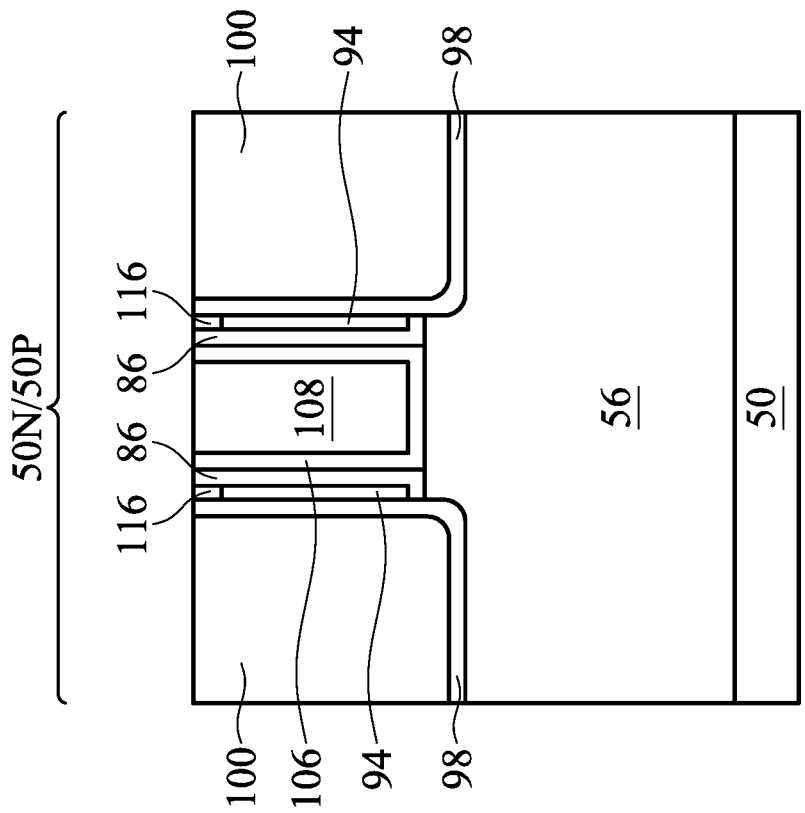
Figure 16B:
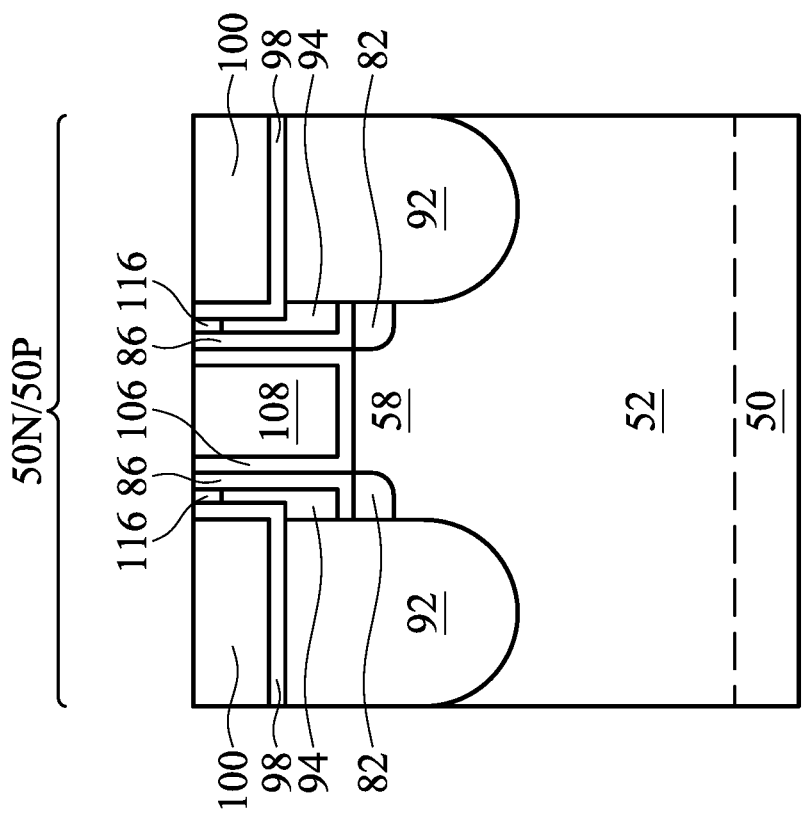
Figure 16E:
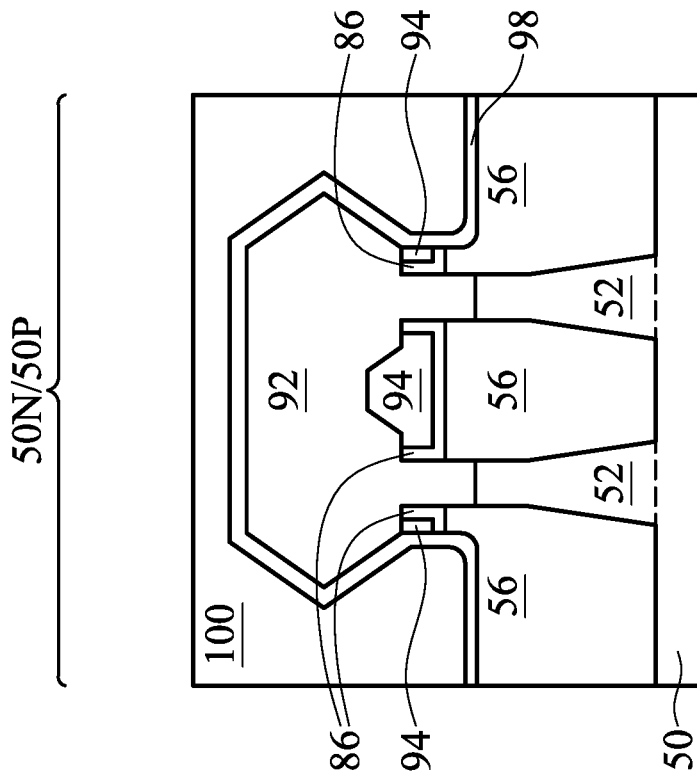
Figure 16D:
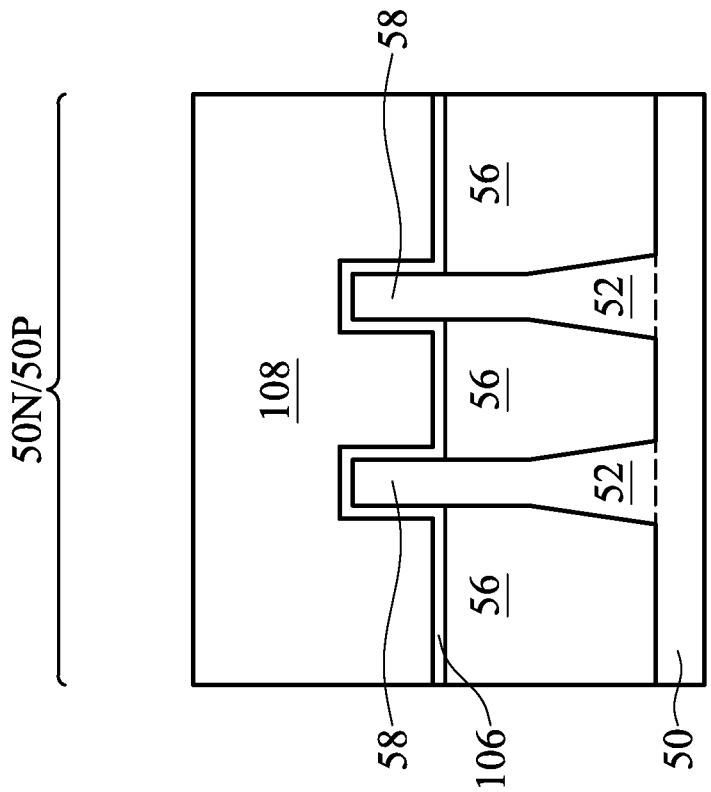
Figure 17A:
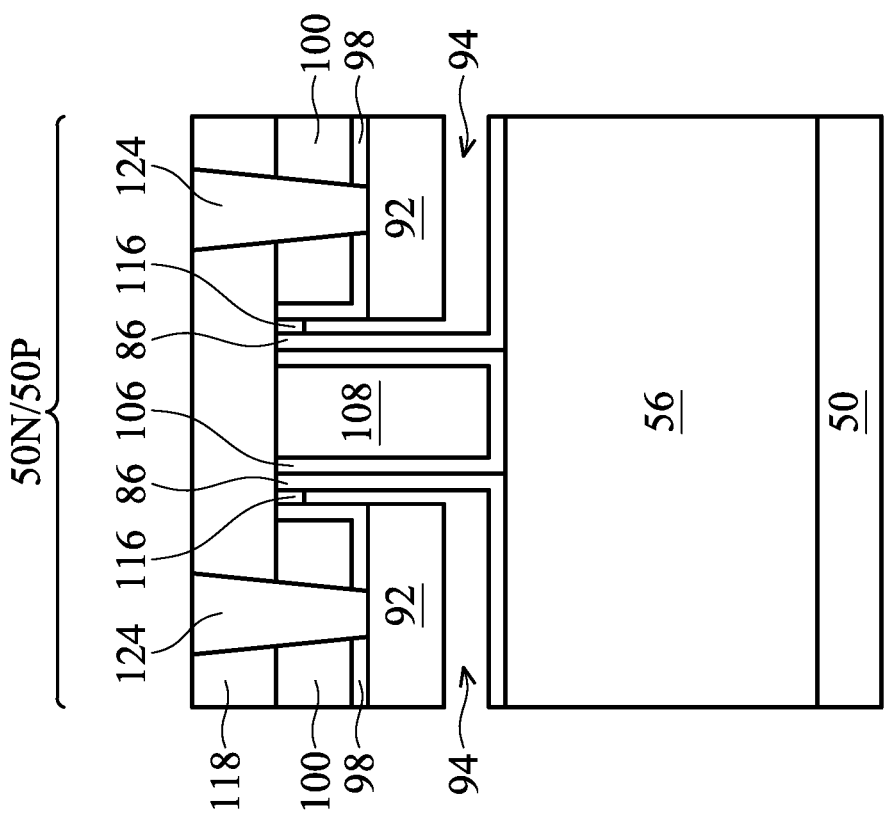
Figure 17C:
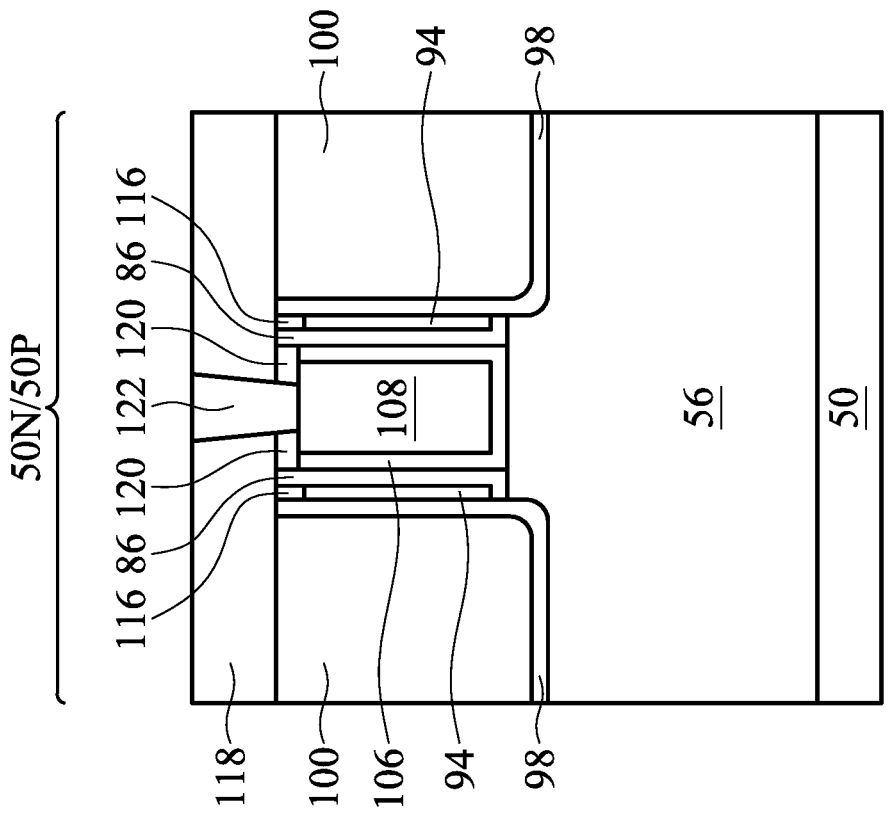
Figure 17B:
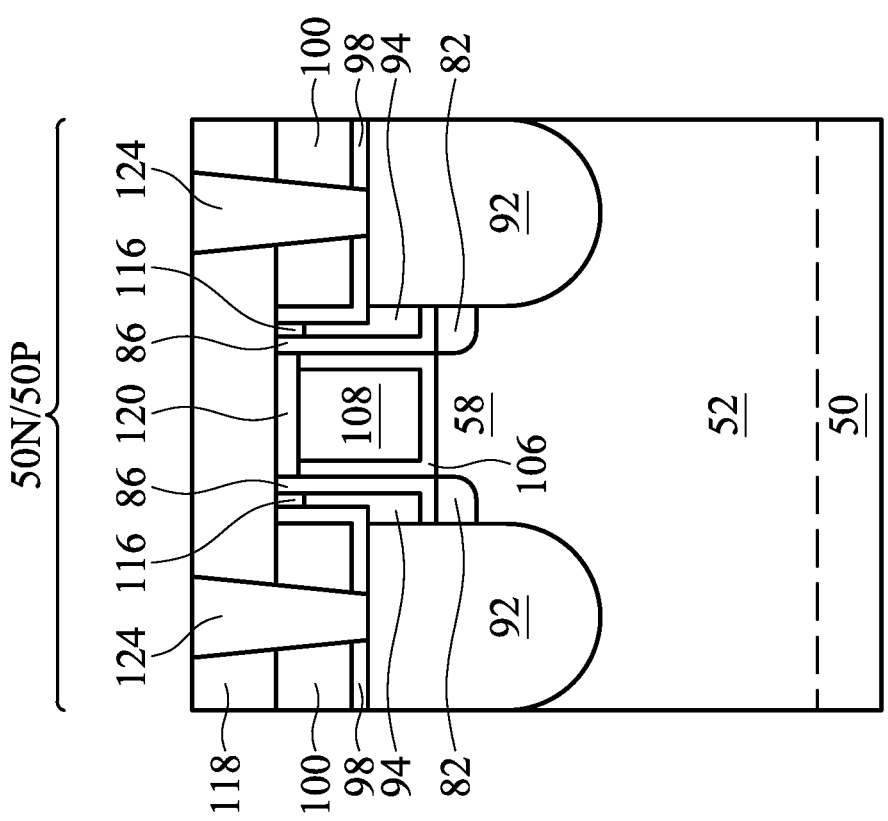
Figure 17E:
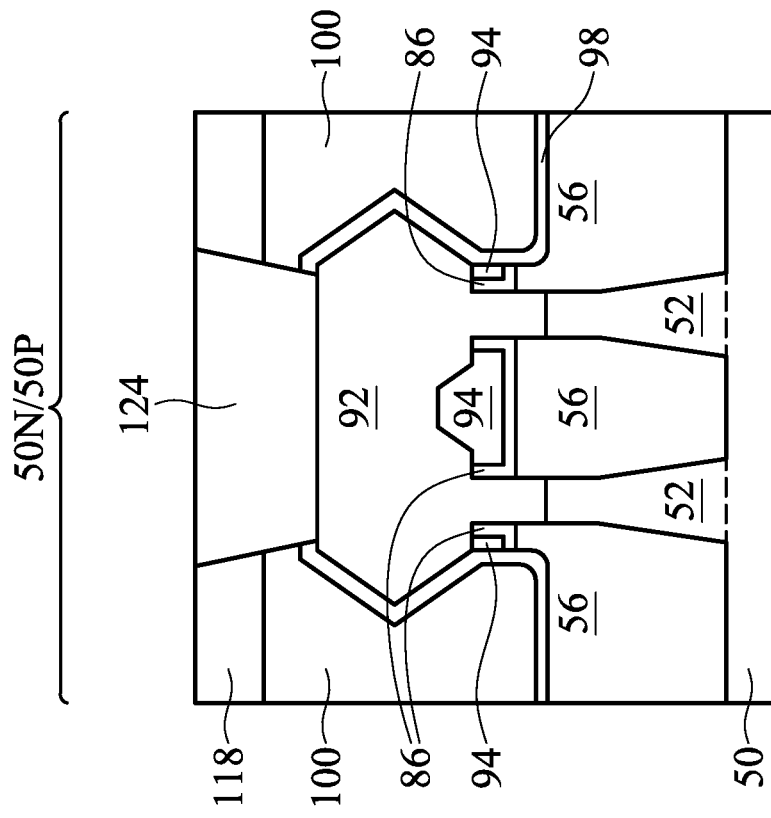
Figure 17D:
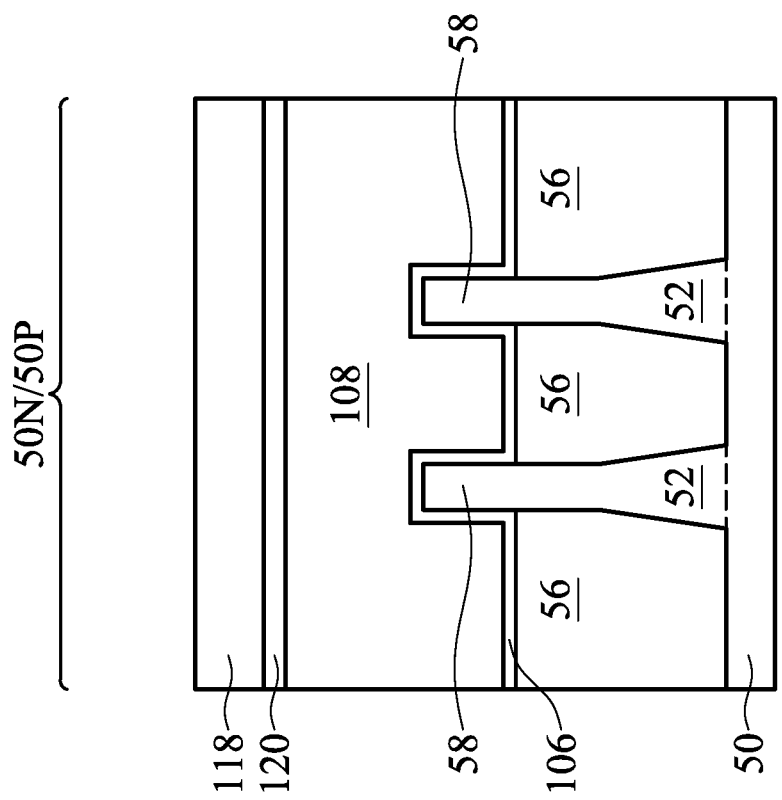

In FIGS. 12A through 12E, gate dielectrics 106 and gate electrodes 108 are formed for replacement gates. FIG. 12F illustrates a detailed view of region 10 of FIG. 12B. The gate dielectrics 106 are deposited conformally in the recesses 104, such as on the top surfaces and the sidewalls of the fins 52 and on sidewalls of the first gate spacers 86. The gate dielectrics 106 may also be formed on top surface of the first ILD 100. In accordance with some embodiments, the gate dielectrics 106 comprise silicon oxide, silicon nitride, or multilayers thereof. In some embodiments, the gate dielectrics 106 include a high-k dielectric material, and in these embodiments, the gate dielectrics 106 may have a k value greater than about 7.0, and may include a metal oxide or a silicate of Hf, Al, Zr, La, Mg, Ba, Ti, Pb, and combinations thereof. The formation methods of the gate dielectrics 106 may include Molecular-Beam Deposition (MBD), ALD, PECVD, and the like. In embodiments where the dummy gate dielectrics 70 remain in the recesses 104, the gate dielectrics 106 include a material of the dummy gate dielectrics 70 (e.g., $SiO_2$).

The gate electrodes 108 are deposited over the gate dielectrics 106, respectively, and fill the remaining portions of the recesses 104. The gate electrodes 108 may include a metal-containing material such as TiN, TiO, TaN, TaC, Co, Ru, Al, W, combinations thereof, or multi-layers thereof. For example, although a single layer gate electrode 108 is illustrated in FIGS. 12A through 12D, the gate electrode 108 may comprise any number of liner layers 108A, any number of work function tuning layers 108B, and a fill material 108C as illustrated by FIG. 12F. After the filling of the gate electrodes 108, a planarization process, such as a CMP, may be performed to remove the excess portions of the gate dielectrics 106 and the material of the gate electrodes 108, which excess portions are over the top surface of the first ILD 100. The remaining portions of material of the gate electrodes 108 and the gate dielectrics 106 thus form replacement gates of the resulting FinFETs. The gate electrodes 108 and the gate dielectrics 106 may be collectively referred to as a "gate stack." The gate and the gate stacks may extend along sidewalls of a channel region 58 of the fins 52.

The formation of the gate dielectrics 106 in the region 50N and the region 50P may occur simultaneously such that the gate dielectrics 106 in each region are formed from the same materials, and the formation of the gate electrodes 108 may occur simultaneously such that the gate electrodes 108 in each region are formed from the same materials. In some embodiments, the gate dielectrics 106 in each region may be formed by distinct processes, such that the gate dielectrics 106 may be different materials, and/or the gate electrodes 108 in each region may be formed by distinct processes, such that the gate electrodes 108 may be different materials. Various masking steps may be used to mask and expose appropriate regions when using distinct processes.

In FIGS. 13A through 13E, protective caps 110 are formed over the first ILD 100. The protective caps 110 will protect the first ILD 100 in subsequent etching processes, preventing removal of the first ILD 100. The protective caps 110 may be formed of a material that includes a metal, such as titanium nitride, titanium, tantalum nitride, tantalum, or the like. The protective caps 110 may also be formed of a non-metallic material, such as silicon nitride, silicon carbide, or the like. As an example of forming the protective caps 110, the first ILD 100 may be recessed using, e.g., an etch-back process. The protective caps 110 may then be deposited in the recesses by a deposition process such as PVD, Radio Frequency PVD (RFPVD), Atomic Layer Deposition (ALD), or the like. After the depositing of the protective caps 110, a planarization process, such as a CMP, may be performed to remove the excess portions of the protective caps 110, which excess portions are over the top surface of the gate stacks and gate spacers.

In FIGS. 14A through 14E, some or all of the residual spacers 96 and second gate spacers 88 are removed to extend the voids 94 along the gate stacks. Thus, after removal, the voids 94 separate the gate stacks from the epitaxial source/drain regions 92. In particular, the voids 94 physically separate portions of the first gate spacers 86 from portions of the CESL 98. Further, as a result of removing the residual spacers 96, the voids 94 beneath the epitaxial source/drain regions 92 are expanded.

The residual spacers 96 and second gate spacers 88 are removed by one or more etching process(es). As noted above, the residual spacers 96 and second gate spacers 88 are formed form the same material, and have high etch selectivity with the material of the first gate spacers 86 and CESL 98. In other words, the etching process(es) etch the material of the residual spacers 96 and second gate spacers 88 at a higher rate than the material(s) of the first gate spacers 86 and CESL 98. The protective caps 110 prevent (or at least reduce) removal of the first ILD 100 during the etching process(es), as the etching process(es) may also be selective to the material of the first ILD 100.

In some embodiments, the etching process(es) are a single etching process. The single etching process is a wet etch performed with etchants including water ($H_2O$) and hydrofluoric (HF) acid, and is performed in an environment containing an inert gas such as nitrogen ($N_2$). The single etching process is performed at a low pressure, such as a pressure in the range of from about 1 Torr to about 25 Torr, and at a low temperature, such as a temperature of less than 0° C. The gate stacks have less lateral support when the voids 94 are extended along the gate stacks. Performing the single etching process at a low temperature and pressure may help avoid deformation of the gate stacks when the lateral support is decreased.

In some embodiments, the etching process(es) include a first etching process and a second etching process. As noted above, the residual spacers 96 and second gate spacers 88 may be doped with impurities of the epitaxial source/drain regions 92 when forming the epitaxial source/drain regions 92, and upper regions may be doped to a higher impurity concentration than lower regions. The first etching process has a higher etch rate at higher impurity concentrations, and is used to remove the upper regions of the residual spacers 96 and second gate spacers 88. In some embodiments, the first etching process is a wet etch performed with etchants including ammonia ($NH_3$) and hydrofluoric (HF) acid, and is performed in an environment containing an inert gas such as nitrogen ($N_2$). The second etching process has a higher etch rate at lower impurity concentrations, and is used to remove the lower regions of the residual spacers 96 and second gate spacers 88. In some embodiments, the second etching process is a plasma etch performed with etchants including nitrogen trifluoride ($NF_3$) and ammonia ($NH_3$), and is performed in an environment containing an inert gas such as nitrogen ($N_2$). The first and second etching processes are also performed at a low pressure, such as a pressure in the range of from about 1 Torr to about 25 Torr, and at a low temperature, such as a temperature of less than 0° C.

In the embodiment shown, the residual spacers 96 and second gate spacers 88 are completely removed. In some embodiments, the residual spacers 96 and second gate spacers 88 are partially removed, and some residual dielectric material of the residual spacers 96 and second gate spacers 88 remains. Further, as discussed below, some residual spacers 96 and second gate spacers 88 may be completely removed and other residual spacers 96 and second gate spacers 88 may be partially removed.

In FIGS. 15A through 15E, a dielectric layer 114 is formed on the protective caps 110, first gate spacers 86, CESL 98, gate dielectrics 106, and gate electrodes 108. The dielectric layer 114 may be formed from a dielectric material such as silicon nitride, silicon oxide, silicon carbonitride, silicon oxycarbonitride, silicon oxycarbide, or the like, and may be formed by a deposition process such as ALD. Notably, the dielectric layer 114 partially fills upper portions of the voids 94. The voids 94 are thus sealed such that materials may not be deposited in the voids 94 during subsequent processing.

In FIGS. 16A through 16E, a planarization process may be performed to remove the protective caps 110 and portions of the dielectric layer 114 overlying the protective caps 110. The planarization process may be a grinding, a CMP, or the like. Remaining portions of the dielectric layer 114 form dielectric plugs 116, sealing the voids 94. After the planarization process, top surfaces of the first ILD 100, dielectric plugs 116, first gate spacers 86, CESL 98, gate dielectrics 106, and gate electrodes 108 are level.

In some embodiments (illustrated below in FIGS. 18A, 19A, and 20A), the planarization process is performed before the dielectric layer 114 is formed, and planarization of the dielectric layer 114 is omitted. For example, a single planarization process may be performed to remove the protective caps 110. After the planarization process, the dielectric layer 114 may be formed over the first ILD 100 and in the upper portions of the voids 94.

In FIGS. 17A through 17E, a second ILD 118 is deposited over the first ILD 100. In some embodiment, the second ILD 118 is a flowable film formed by a flowable CVD method. In some embodiments, the second ILD 118 is formed of a dielectric material such as PSG, BSG, BPSG, USG, or the like, and may be deposited by any suitable method, such as CVD and PECVD. In embodiments where planarization of the dielectric layer 114 is omitted, the dielectric layer 114 may be used as an etch-stop layer between the first ILD 100 and second ILD 118.

In accordance with some embodiments, before the formation of the second ILD 118, the gate stack (including a gate dielectric 106 and a corresponding overlying gate electrode 108) is recessed, so that a recess is formed directly over the gate stack and between opposing portions of the first gate spacers 86. A gate mask 120 comprising one or more layers of dielectric material, such as silicon nitride, silicon oxynitride, or the like, is filled in the recess, followed by a planarization process to remove excess portions of the dielectric material extending over the first ILD 100. The gate mask 120 is laterally disposed between pairs of the first gate spacers 86.

Further, gate contacts 122 and source/drain contacts 124 are formed through the second ILD 118 and the first ILD 100 in accordance with some embodiments. Openings for the source/drain contacts 124 are formed through the first ILD 100 and second ILD 118, and openings for the gate contact 122 are formed through the second ILD 118 and the gate mask 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. The dielectric plugs 116 prevent any material of the liner or conductive material from being deposited in the voids 94, which helps prevent shorting of the gate electrodes 108 and epitaxial source/drain regions 92. A planarization process, such as a CMP, may be performed to remove excess material from a surface of the second ILD 118. The remaining liner and conductive material form the source/drain contacts 124 and gate contacts 122 in the openings. An anneal process may be performed to form a silicide at the interface between the epitaxial source/drain regions 92 and the source/drain contacts 124. The source/drain contacts 124 are physically and electrically coupled to the epitaxial source/drain regions 92. The gate contacts 122 penetrate through the gate mask 120 to physically and electrically couple the gate electrodes 108. The source/drain contacts 124 and gate contacts 122 may be formed in different processes, or may be formed in the same process. Although shown as being formed in the same cross-sections, it should be appreciated that each of the source/drain contacts 124 and gate contacts 122 may be formed in different cross-sections, which may avoid shorting of the contacts.

Figure 18A:
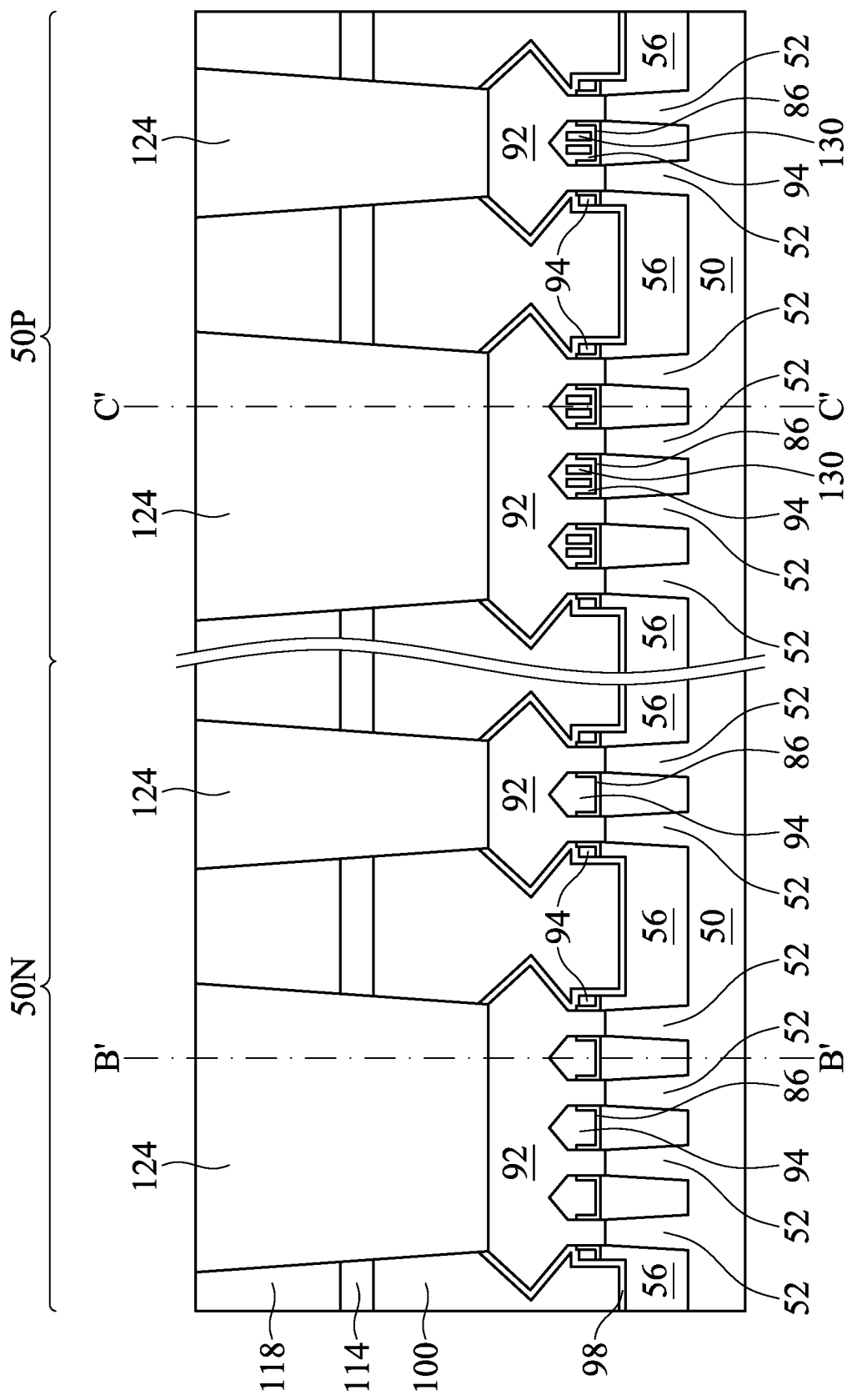

FIGS. 18A through 18C illustrate the resulting FinFETs, in accordance with some embodiments. FIG. 18A is shown along cross-section reference cross-section E-E illustrated in FIG. 1, and illustrates both the region 50N and the region 50P. FIG. 18B is shown along reference cross-section B'-B' illustrated in FIG. 18A (e.g., in the region 50N), and FIG. 18C is shown along reference cross-section C'-C' illustrated in FIG. 18A (e.g., in the region 50P). FIGS. 18A through 18C show an embodiment where the FinFETs have merged neighboring epitaxial source/drain regions 92. The FinFETs may have two merged epitaxial source/drain regions 92, or more than two merged epitaxial source/drain regions 92, such as four.

As noted above, the residual spacers 96 and second gate spacers 88 in the regions 50N and 50P may be removed at different rates. In particular, the residual spacers 96 and second gate spacers 88 doped with n-type impurities (e.g., in the region 50N) are removed at a faster rate than the residual spacers 96 and second gate spacers 88 doped with p-type impurities (e.g., in the region 50P). As such, some residue 130 remains in the region 50P but not in the region 50N. The residue 130 may be dielectric material of the residual spacers 96 and/or second gate spacers 88.

Further, in the embodiment shown, the protective caps 110 are removed before the dielectric layer 114 is formed, and planarization of the dielectric layer 114 is omitted. The dielectric layer 114 may thus be used as an etch-stop layer between the first ILD 100 and second ILD 118. Further, the dielectric layer 114 protects the voids 94 from being filled when forming the source/drain contacts 124.

Figure 19A:
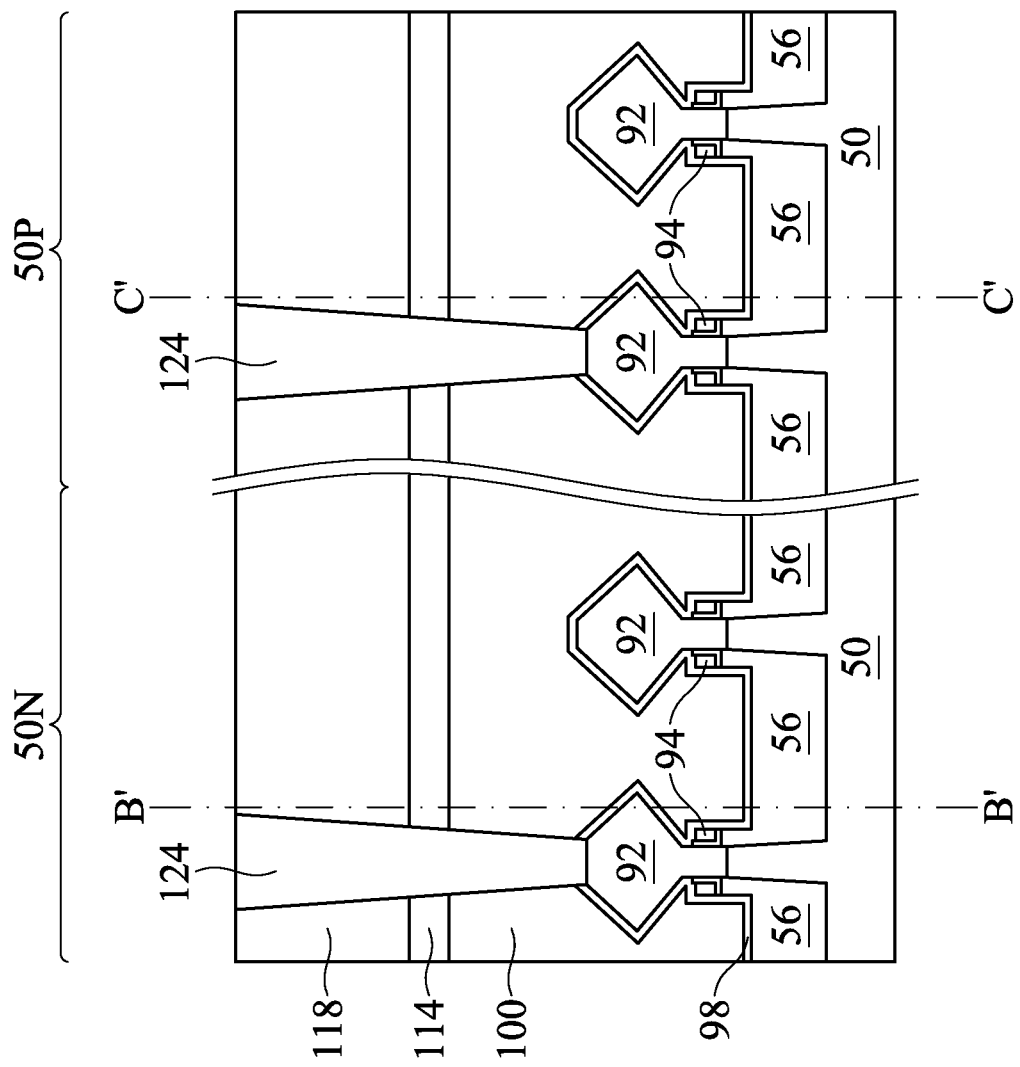
FIGS. 19A through 19C illustrate FinFETs, in accordance with some embodiments.
Figure 19C:
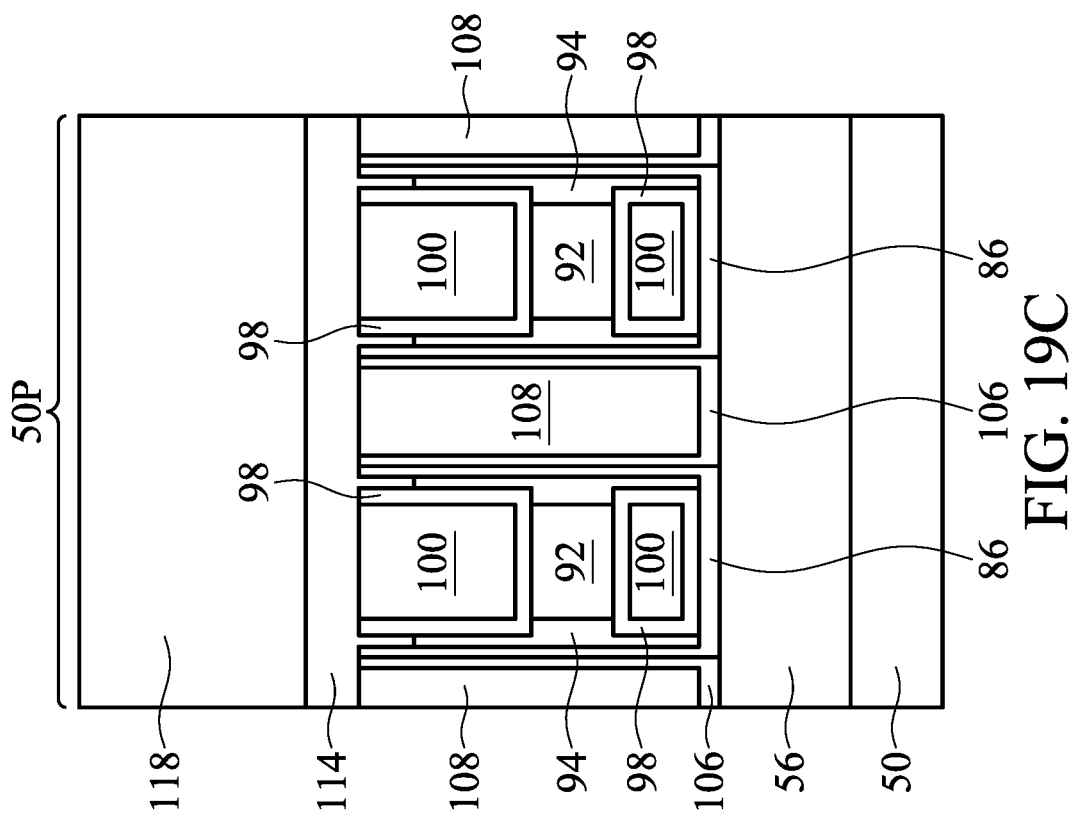
Figure 19B:
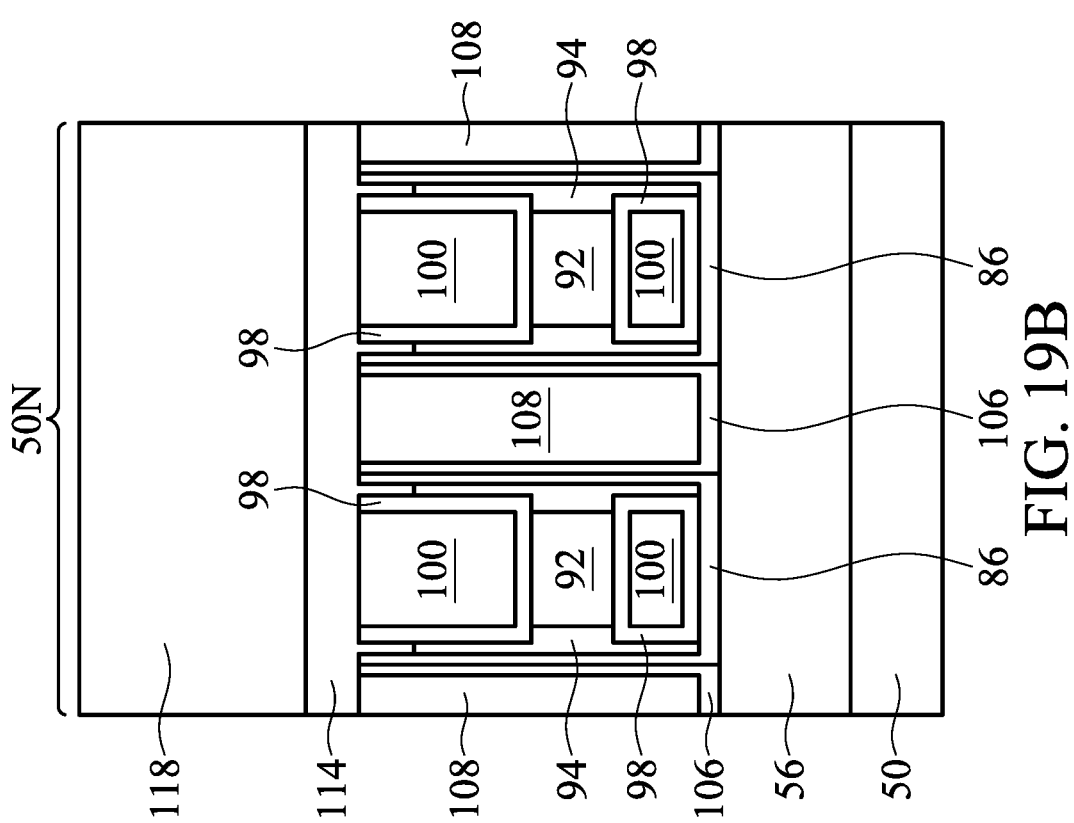

FIGS. 19A through 19C illustrate the resulting FinFETs, in accordance with some other embodiments. FIG. 19A is shown along cross-section reference cross-section E-E illustrated in FIG. 1, and illustrates both the region 50N and the region 50P. FIG. 19B is shown along reference cross-section B'-B' illustrated in FIG. 19A (e.g., in the region 50N), and FIG. 19C is shown along reference cross-section C'-C' illustrated in FIG. 19A (e.g., in the region 50P). The embodiment of FIGS. 19A through 19C is similar to the embodiment of FIGS. 18A through 18C, except the FinFETs have a single unmerged epitaxial source/drain region 92.

Figure 20A:
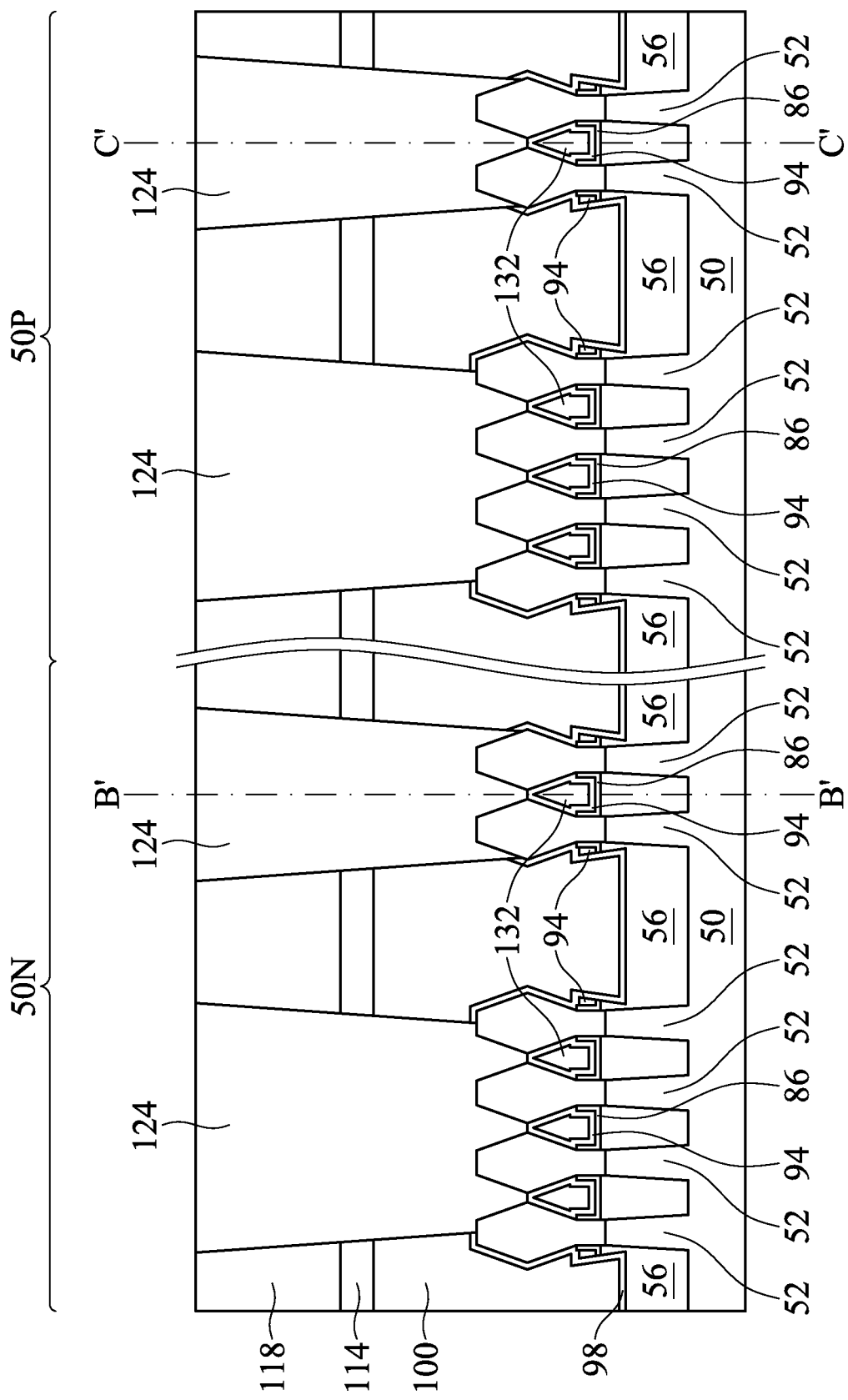
FIGS. 20A through 20C illustrate FinFETs, in accordance with some other embodiments.
Figures 20B, 20C:
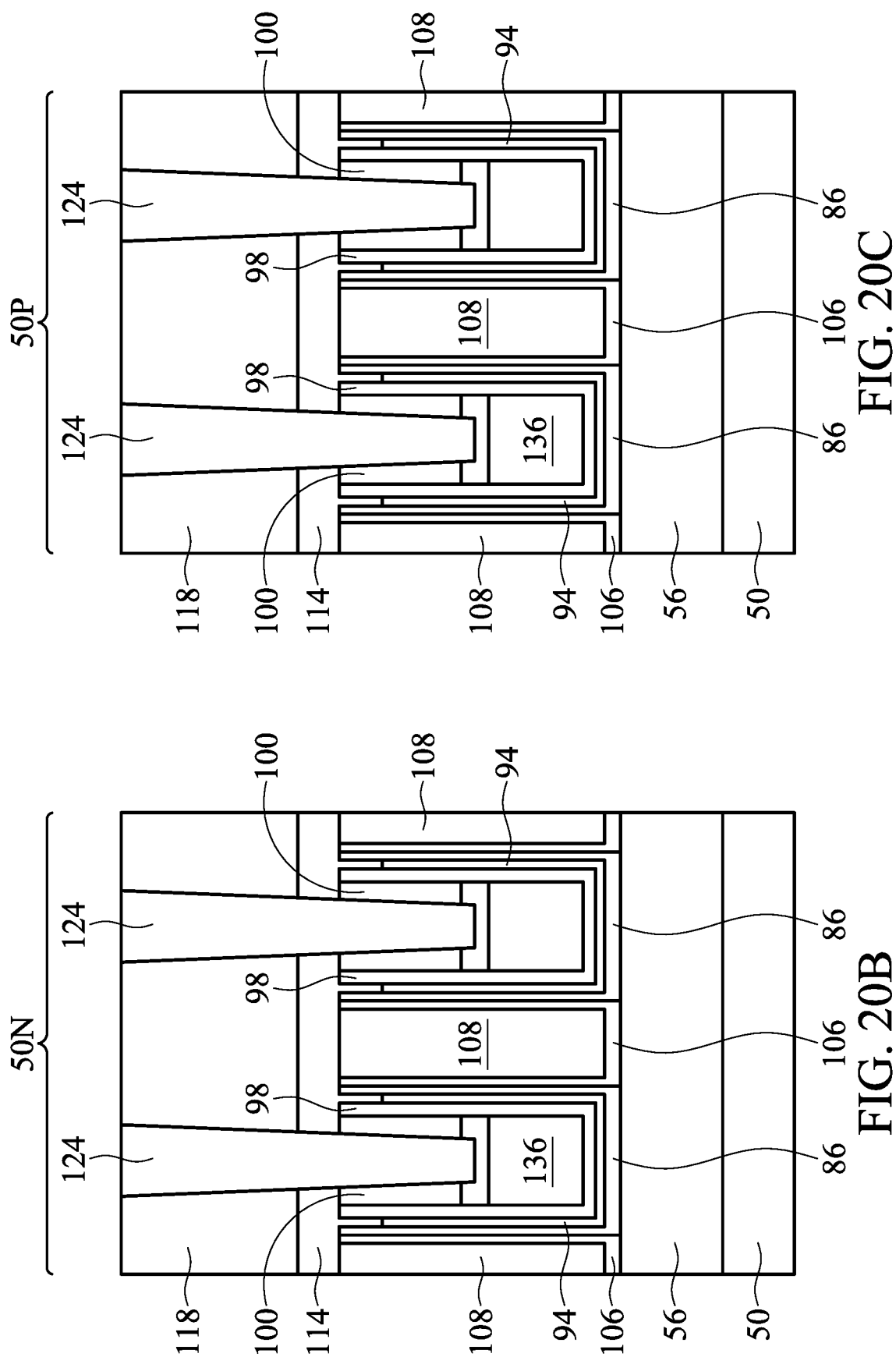

FIGS. 20A through 20C illustrate the resulting FinFETs, in accordance with some other embodiments. FIG. 20A is shown along cross-section reference cross-section E-E illustrated in FIG. 1, and illustrates both the region 50N and the region 50P. FIG. 20B is shown along reference cross-section B'-B' illustrated in FIG. 20A (e.g., in the region 50N), and FIG. 20C is shown along reference cross-section C'-C' illustrated in FIG. 20A (e.g., in the region 50P). The embodiment of FIGS. 20A through 20C is similar to the embodiment of FIGS. 19A through 19C, except the FinFETs have multiple unmerged epitaxial source/drain region 92. In some embodiments, pinch-off may occur between unmerged epitaxial source/drain region 92 when depositing the dielectric material layer of the CESL 98, thereby forming additional voids 132 between the unmerged epitaxial source/drain region 92.

Embodiments may achieve advantages. The voids 94 comprise air or a vacuum, both of which have a lower relative permittivity than the dielectric material of the material of the removed second gate spacers 88. At smaller device sizes, the capacitance between the source/drain contacts 124 and gate electrodes 108 may be a significant source of circuit capacitance. Increasing the relative permittivity of the space between the source/drain contacts 124 and gate electrodes 108 reduces that capacitance. The capacitance reduction may increase the final device performance of the resulting FinFETs.

In an embodiment, a method includes: forming a first fin extending from a substrate; forming a gate stack on the first fin; depositing a first gate spacer along a side of the gate stack, the first gate spacer including a first dielectric material; depositing a second gate spacer along a side of the first gate spacer, the second gate spacer including a second dielectric material, the second dielectric material being different from the first dielectric material; forming a source/drain region in the first fin adjacent the second gate spacer; depositing a contact etch stop layer (CESL) along a side of the second gate spacer and over the source/drain region, the CESL including a third dielectric material, the second dielectric material being different from the third dielectric material; removing at least a portion of the second gate spacer to form a void between the first gate spacer and the CESL; and forming a source/drain contact through the CESL to couple the source/drain region, the void physically separating the source/drain contact from the gate stack.

In some embodiments of the method, the first dielectric material is different from the third dielectric material. In some embodiments of the method, the first dielectric material is the same as the third dielectric material. In some embodiments of the method, removing the second gate spacer includes: etching the second gate spacer with a wet etch process, the wet etch process being performed with etchants including water and hydrofluoric acid, the wet etch process being performed at a temperature of less than 0° C. and at a pressure of from 1 Torr to 25 Torr. In some embodiments of the method, the wet etch process is performed in an environment containing an inert gas. In some embodiments of the method, removing the second gate spacer includes: etching an upper region of the second gate spacer with a wet etch process, the wet etch process being performed with etchants including ammonia and hydrofluoric acid, the wet etch process being performed at a temperature of less than 0° C. and at a pressure of from 1 Torr to 25 Torr; and etching a lower region of the second gate spacer with a plasma etch process, the plasma etch process being performed with etchants including nitrogen trifluoride and ammonia, the plasma etch process being performed at a temperature of less than 0° C. and at a pressure of from 1 Torr to 25 Torr. In some embodiments of the method, the wet etch process and the plasma etch process are both performed in an environment containing an inert gas. In some embodiments of the method, the source/drain region and the second gate spacer are doped with a p-type impurity, and where the second gate spacer is partially removed. In some embodiments of the method, the source/drain region and the second gate spacer are doped with a n-type impurity, and where the second gate spacer is completely removed. In some embodiments, the method further includes: depositing a first interlayer dielectric (ILD) over the CESL; and forming a cap over the first ILD, the cap protecting the first ILD during the removing. In some embodiments, the method further includes: depositing a dielectric layer over the cap and partially in the void; and removing the cap and portions of the dielectric layer disposed outside of the void with a planarization process, remaining portions of the dielectric layer forming dielectric plugs sealing the void. In some embodiments, the method further includes: depositing a second ILD over the first ILD and the dielectric plugs, the source/drain contact being further formed through the first ILD and the second ILD. In some embodiments, the method further includes: forming a second fin extending from the substrate, the gate stack being further formed on the second fin, the source/drain region being further formed in the second fin, the void further extending beneath the source/drain region after the removing.

In an embodiment, a method includes: forming a first fin and a second fin extending from a substrate; forming a first gate stack over the first fin and a second gate stack over the second fin; depositing a first gate spacer layer along a side of the first gate stack and along a side of the second gate stack; depositing a second gate spacer layer over the first gate spacer layer, the second gate spacer layer having a first portion proximate the first gate stack and a second portion proximate the second gate stack; forming a first source/drain region in the first fin and a second source/drain region in the second fin, the first source/drain region being adjacent the first portion of the second gate spacer layer, the second source/drain region being adjacent the second portion of the second gate spacer layer; and removing portions of the second gate spacer layer to form a first void and a second void, the first void separating the first source/drain region from the first gate spacer layer, the second void separating the second source/drain region from the second gate spacer layer, the removing including: etching the first gate spacer layer at a first etch rate; etching the first portion of the second gate spacer layer at a second etch rate; and etching the second portion of the second gate spacer layer at a third etch rate, the second etch rate being greater than the first etch rate, the third etch rate being greater than the second etch rate.

In some embodiments of the method, forming the first source/drain region includes doping the first source/drain region and the first portion of the second gate spacer layer to have a first conductivity type, and where forming the second source/drain region includes doping the second source/drain region and the second portion of the second gate spacer layer to have a second conductivity type. In some embodiments of the method, during the removing, features with the first conductivity type are etched at a different rate than features with the second conductivity type. In some embodiments of the method, after the removing, the first portion of the second gate spacer layer and the second portion of the second gate spacer layer are completely removed. In some embodiments of the method, after the removing, the first portion of the second gate spacer layer is partially removed, and the second portion of the second gate spacer layer is completely removed.

In an embodiment, a device includes: a first fin extending from a substrate; a gate stack disposed on the first fin; a source/drain region disposed in the first fin; a contact etch stop layer (CESL) disposed over the source/drain region; a gate spacer extending along a side of the gate stack; and a dielectric plug disposed between the CESL and the gate spacer, where the dielectric plug, the CESL, the gate spacer, and the source/drain region collectively define a void physically separating the gate stack from the source/drain region.

In some embodiments, the device further includes: a second fin extending from the substrate, the source/drain region being further disposed in the second fin, where the void extends under portions of the source/drain region disposed between the first fin and the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an isolation region on a substrate;
   a first fin protruding above and from between neighboring portions of the isolation region;
   a gate stack disposed on the first fin;
   a source/drain region disposed in the first fin;
   a contact etch stop layer (CESL) disposed over the source/drain region;
   a gate spacer extending along a side of the gate stack; and
   a dielectric plug disposed between the CESL and the gate spacer,
   wherein the dielectric plug, the CESL, the gate spacer, and the source/drain region collectively define a void physically separating the gate stack from the source/drain region, the void having a vertical portion disposed between the gate spacer and the CESL and having a horizontal portion disposed between the source/drain region and the isolation region.

2. The device of claim 1, further comprising:
   a second fin protruding above and from between neighboring portions of the isolation region, the source/drain region being further disposed in the second fin,
   wherein the horizontal portion of the void extends under portions of the source/drain region disposed between the first fin and the second fin.

3. The device of claim 2, wherein the gate spacer also extends along a portion of the isolation region between the first fin and the second fin.

4. The device of claim 1, further comprising:
   a contact extending through the CESL, the contact connected to the source/drain region, the vertical portion of the void disposed between the contact and the gate stack.

5. The device of claim 1, wherein the gate spacer and the source/drain region each comprise an n-type impurity.

6. The device of claim 1, wherein the gate spacer and the source/drain region each comprise a p-type impurity.

7. A device comprising:
   an isolation region on a substrate;
   a gate stack on a top surface of the isolation region;
   a gate spacer having a vertical portion on a sidewall of the gate stack and having a horizontal portion on the top surface of the isolation region;
   a source/drain region above the horizontal portion of the gate spacer, the vertical portion of the gate spacer disposed between the source/drain region and the gate stack;
   a contact etch stop layer (CESL) on the source/drain region; and
   a dielectric plug between the CESL and the vertical portion of the gate spacer,
   wherein the dielectric plug, the CESL, the gate spacer, and the source/drain region collectively define a void physically separating the gate stack from the source/drain region.

8. The device of claim 7, further comprising:
   a first fin protruding above the isolation region; and
   a second fin protruding above the isolation region, the source/drain region adjacent channel regions of the first fin and the second fin, the gate stack disposed on the channel regions of the first fin and the second fin.

9. The device of claim 7, wherein the void has a horizontal portion and a vertical portion, the horizontal portion of the void disposed between the source/drain region and the horizontal portion of the gate spacer, the vertical portion of the void disposed between the source/drain region and the vertical portion of the gate spacer.

10. The device of claim 9, further comprising:
    a contact extending through the CESL, the contact connected to the source/drain region, the vertical portion of the void disposed between the contact and the gate stack.

11. The device of claim 7, wherein the gate spacer and the source/drain region each comprise an n-type impurity.

12. The device of claim 7, wherein the gate spacer and the source/drain region each comprise a p-type impurity.

13. A device comprising:
    an isolation region on a substrate;
    a first fin protruding above the isolation region;
    a second fin protruding above the isolation region;
    a source/drain region adjacent channel regions of the first fin and the second fin, a portion of the isolation region disposed beneath the source/drain region;
    a gate stack on the channel regions of the first fin and the second fin;
    a gate spacer having a vertical portion between the gate stack and the source/drain region and having a horizontal portion between the portion of the isolation region and the source/drain region; and
    a void between the source/drain region and each of the vertical portion and the horizontal portion of the gate spacer.

14. The device of claim 13, further comprising:
    a contact etch stop layer (CESL) on the source/drain region;
    an inter-layer dielectric (ILD) on the CESL; and
    a contact extending through the ILD and the CESL, the contact connected to the source/drain region, the void disposed between the contact and the gate stack.

15. The device of claim 14, further comprising:
    a dielectric plug between the CESL and the vertical portion of the gate spacer, top surfaces of the dielectric plug, the ILD, and the gate spacer being level.

16. The device of claim 15, wherein the void is defined by the dielectric plug, the CESL, the gate spacer, and the source/drain region.

17. The device of claim 14, further comprising:
    a dielectric layer on the ILD and the gate stack, a portion of the dielectric layer disposed between the CESL and the vertical portion of the gate spacer.

18. The device of claim 17, wherein the void is defined by the portion of the dielectric layer, the CESL, the gate spacer, and the source/drain region.

19. The device of claim 13, wherein the gate spacer and the source/drain region each comprise an n-type impurity.

20. The device of claim 13, wherein the gate spacer and the source/drain region each comprise a p-type impurity.

* * * * *